US011744167B2

(12) United States Patent
Yang et al.

(10) Patent No.: US 11,744,167 B2
(45) Date of Patent: Aug. 29, 2023

(54) SEMICONDUCTOR APPARATUS INCLUDING A PHASE CHANGE MATERIAL LAYER HAVING A FIRST AND A SECOND CHALCOGEN LAYER

(71) Applicant: Samsung Electronics Co., Ltd., Suwon-si (KR)

(72) Inventors: Kiyeon Yang, Seoul (KR); Dongho Ahn, Hwaseong-si (KR); Changseung Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 57 days.

(21) Appl. No.: 17/330,950

(22) Filed: May 26, 2021

(65) Prior Publication Data

US 2022/0173316 A1    Jun. 2, 2022

(30) Foreign Application Priority Data

Nov. 27, 2020 (KR) .................. 10-2020-0163333
Dec. 30, 2020 (KR) .................. 10-2020-0188076

(51) Int. Cl.
*H10N 70/00* (2023.01)
*H10B 63/00* (2023.01)
*H10N 70/20* (2023.01)

(52) U.S. Cl.
CPC ......... *H10N 70/8828* (2023.02); *H10B 63/24* (2023.02); *H10B 63/84* (2023.02);
(Continued)

(58) Field of Classification Search
CPC .............. H01L 45/144; H01L 27/2427; H01L 27/2481; H01L 45/06; H01L 45/126;
(Continued)

(56) References Cited

U.S. PATENT DOCUMENTS 8,693,241 B2    4/2014   Kim et al.
9,024,284 B2    5/2015   Oyanagi et al.
(Continued)

FOREIGN PATENT DOCUMENTS

CN    110571235 A    12/2019
JP      5957375 B2     7/2016
(Continued)

OTHER PUBLICATIONS

Yang et al., "GETE/SB7TE3 SuperlatticeLike Structure for Lateral Phase Change Memory",Applied Physics Letters 94, 203110 (2009).
(Continued)

*Primary Examiner* — Jerome Leboeuf
(74) *Attorney, Agent, or Firm* — Harness, Dickey & Pierce, P.L.C.

(57) ABSTRACT

Semiconductor unit devices may be arranged between a first insulating layer and a second insulating layer that are apart from each other in a direction normal to a substrate. Each of the semiconductor unit devices may include a selection device layer and a phase change material layer that extend side by side in a direction parallel to the substrate. The phase change material layer may have a superlattice-like structure. The phase change material layer may be arranged along a recess portion that is formed by the first insulating layer, the second insulating layer, and the selection device layer.

20 Claims, 20 Drawing Sheets

(52) U.S. Cl.
CPC ......... H10N 70/066 (2023.02); H10N 70/231 (2023.02); H10N 70/8413 (2023.02)

(58) Field of Classification Search
CPC ............. H01L 45/1683; H01L 27/2409; H01L 27/249; H01L 45/065; H01L 45/1226; H01L 45/142; H01L 27/2463; H10N 70/8828; H10N 70/066; H10N 70/231; H10N 70/8413; H10N 70/235; H10N 70/823; H10N 70/8822; H10B 63/24; H10B 63/84; H10B 63/20; H10B 63/845; H10B 63/80

See application file for complete search history.

(56) References Cited

U.S. PATENT DOCUMENTS

| | | | |
|---|---|---|---|
| 9,450,023 | B1 | 9/2016 | Konevecki et al. |
| 10,381,559 | B1* | 8/2019 | Zhou ...................... H01L 27/24 |
| 10,644,065 | B2 | 5/2020 | Takashima |
| 2010/0163825 | A1 | 7/2010 | Dennison et al. |
| 2014/0145137 | A1 | 5/2014 | Ju et al. |
| 2014/0241050 | A1 | 8/2014 | Nakai et al. |
| 2018/0114900 | A1* | 4/2018 | Kamata ............... H01L 27/2463 |
| 2019/0088868 | A1 | 3/2019 | Kamata |
| 2019/0189692 | A1* | 6/2019 | Jeong ................. G11C 13/0004 |
| 2021/0005665 | A1* | 1/2021 | Fantini .................. H01L 27/249 |
| 2021/0202576 | A1* | 7/2021 | Yoo ....................... H01L 27/249 |
| 2022/0093861 | A1* | 3/2022 | Givens ................. H01L 45/144 |

FOREIGN PATENT DOCUMENTS

| | | |
|---|---|---|
| JP | 2019-057604 A | 4/2019 |
| JP | 2020-047316 A | 3/2020 |
| KR | 20190124106 A | 11/2019 |

OTHER PUBLICATIONS

Shi et al., "Growth-Dominant Superlattice-Like Medium and Its Application in Phase Change Memory", ECS Journal of Solid State Science and Technology 4 ,3 N13-N17 (2015).

Momand et al., "Interface Formation of Two-and-Three-Dimensionally Bonded Materials in the Case of GETE-SB2TE3 Superlattices", Nanoscale, 2015, 7, 19136.

Simpson et al., "Interfacial Phase-Change Memory", Nature Nanotech., 2011, 6, 501.

Tominaga et al., "Ferroelectric Order Control of the Dirac-Semimetal Phase in GETE-SB2TE3 Superlattices", Adv. Mater. Interfaces 2014, 1, 1300027.

Extended European Search Report dated Jan. 21, 2022, issued in corresponding European Patent Application No. 21183408.0.

\* cited by examiner

SEMICONDUCTOR APPARATUS INCLUDING A PHASE CHANGE MATERIAL LAYER HAVING A FIRST AND A SECOND CHALCOGEN LAYER

CROSS-REFERENCE TO RELATED APPLICATIONS

This application is based on and claims priority under 35 U.S.C. § 119 to Korean Patent Application Nos. 10-2020-0163333, filed on Nov. 27, 2020, and 10-2020-0188076, filed on Dec. 30, 2020, in the Korean Intellectual Property Office, the disclosures of which are incorporated by reference herein in their entirety.

BACKGROUND

1. Field

The present disclosure relates to a semiconductor device including a selection device layer and a variable resistance layer, and a semiconductor apparatus including the selection device.

2. Description of the Related Art

The demand for high integration of semiconductor devices is increasing according to the tendency of electronic products to be light, thin, and short. Therefore, various types of semiconductor devices have been proposed, for example, a semiconductor device including a variable resistance layer and a selection device layer.

SUMMARY

Provided are semiconductor apparatuses configured to be driven with low power and having a high degree of integration.

Additional aspects will be set forth in part in the description that follows and, in part, will be apparent from the description, or may be learned by practice of the presented embodiments of the disclosure.

According to an embodiment, a semiconductor apparatus may include a first insulating layer and a second insulating layer that are apart from each other in a direction normal to a substrate; and a semiconductor unit device between the first insulating layer and the second insulating layer. The semiconductor unit device may include a selection device layer and a phase change material layer that extend side by side in a direction parallel to the substrate. The selection device layer may form a recess portion by covering a portion of a surface of the first insulating layer and a portion of a surface of the second insulating layer such that a sidewall of the sidewall of a selection device layer is recessed relative to a sidewall of the first insulating layer and a sidewall of the second insulating layer. The phase change material layer may be arranged along the recess portion to cover the first insulating layer, the selection device layer, and the second insulating layer. A length of a surface of the phase change material layer adjacent to the first insulating layer may be equal to or greater than a length of a surface of the phase change material layer adjacent to the selection device layer. The phase change material layer may include a first chalcogen layer including $Ge_xTe_{1-x}$ ($0.3 \leq x \leq 0.7$) and a second chalcogen layer including $Sb_yTe_{1-y}$ ($0.2 \leq y \leq 0.8$).

In some embodiments, the length of the surface of the phase change material layer adjacent to the first insulating layer may be greater than the length of the surface of the phase change material layer adjacent to the selection device layer by a factor of greater than about 1.0 to about 5.0.

In some embodiments, the phase change material layer may have a superlattice-like structure.

In some embodiments, the first chalcogen layer and the second chalcogen layer may be alternately arranged one or more times in the direction parallel to the substrate.

In some embodiments, the first chalcogen layer and the second chalcogen layer each independently may have a thickness of about 1 nm to about 20 nm in the direction parallel to the substrate.

In some embodiments, the first chalcogen layer, the second chalcogen layer, or both the first chalcogen layer and the second chalcogen layer each independently may include at least one dopant material selected from the group consisting of carbon (C), nitrogen (N), indium (In), zinc (Zn), Scandium (Sc), and tin (Sn).

In some embodiments, the selection device layer and the phase change material layer are electrically connected to each other.

In some embodiments, a heating electrode layer may be between the selection device layer and the phase change material layer.

In some embodiments, the phase change material layer may have a thickness of about 30 nm to about 100 nm.

In some embodiments, the selection device layer may include a p-n junction, or may include a mixed ion-electron conductor (MIEC) or a Mott transition device.

In some embodiments, the selection device layer may include a material having ovonic threshold switching characteristics.

In some embodiments, the selection device layer may include: a first element including germanium (Ge) and/or tin (Sn); a second element including arsenic (As), antimony (Sb), and/or bismuth (Bi); and a third element including sulfur (S), selenium (Se), and/or tellurium (Te).

In some embodiments, the selection device layer and the phase change material layer may be electrically connected to each other.

In addition, the semiconductor apparatus may further include a first electrode electrically connected to the selection device layer and a second electrode electrically connected to the phase change material layer. The first electrode and/or the second electrode may be a common electrode that electrically connect a plurality of semiconductor unit devices to each other.

In some embodiments, the semiconductor apparatus may include a plurality of semiconductor unit devices on the substrate. The semiconductor unit device may be one of the plurality of semiconductor unit devices, and the plurality of semiconductor unit devices may include the first electrode or the second electrode as a common electrode.

In some embodiments, the selection device layer may include a material having ovonic threshold switching characteristics.

In some embodiments, the selection device layer may include at least one first element selected from the group consisting of germanium (Ge) and tin (Sn); at least one second element selected from the group consisting of arsenic (As), antimony (Sb), and bismuth (Bi); and at least one third element selected from the group consisting of sulfur (S), selenium (Se), and tellurium (Te).

According to an embodiment, a semiconductor apparatus may include a substrate; an insulating layer on the substrate; a first semiconductor device comprising a first selection device layer and a first phase change material layer that extend side by side in a direction parallel to the substrate; and a second semiconductor device comprising a second selection device layer and a second phase change material layer that extend side by side in the direction parallel to the substrate. The first semiconductor device and the second semiconductor device may be apart from each other with the insulating layer between the first semiconductor device and the second semiconductor device in a direction normal to the substrate. The first phase change material layer and the second phase change material layer each independently may include a first chalcogen layer comprising GexTe1-x ($0.3 \leq x \leq 0.7$) and a second chalcogen layer comprising SbyTe1-y ($0.2 \leq y \leq 0.8$). The first chalcogen layer and the second chalcogen layer may extend in the direction parallel to the substrate.

In some embodiments, the first phase change material layer and the second phase change material layer may be electrically insulated from each other by the insulating layer.

In some embodiments, the insulating layer may have a thickness of about 5 nm to about 50 nm.

In some embodiments, the first phase change material layer and the second phase change material layer each independently may have a thickness of about 30 to about 100 nm in the direction parallel to the substrate.

In some embodiments, the first chalcogen layer, the second chalcogen layer, or both the first chalcogen layer and the second chalcogen layer one or both of the first chalcogen layer and the second chalcogen layer each independently may include at least one dopant material selected from the group consisting of carbon (C), nitrogen (N), indium (In), zinc (Zn), Scandium (Sc), and tin (Sn).

In some embodiments, the semiconductor apparatus may further include a first electrode electrically connected to any one of the first selection device layer and the second selection device layer.

In some embodiments, the semiconductor apparatus may further include a second electrode electrically connected to the first phase change material layer and the second phase change material layer. The second electrode may extend in the direction normal to the substrate.

According to an embodiment, a semiconductor apparatus may include a plurality of first electrodes; a plurality of second electrodes crossing the plurality of first electrodes; and a plurality of semiconductor unit devices spaced apart from each other and respectively arranged at intersections between the plurality of first electrodes and the plurality of second electrodes. Each semiconductor unit device, among the plurality of semiconductor unit devices, may be electrically connected to a corresponding one of the plurality of first electrodes and a corresponding one of the plurality of second electrodes. Each semiconductor unit device may include a selection device layer and at least part of a phase change material layer that may be electrically connected to each other. The phase change material layer may include a plurality of first chalcogen layers and a plurality of second chalcogen layers alternately arranged. Each of the plurality of first chalcogen layers may include $Ge_xTe_{1-x}$ ($0.3 \leq x \leq 0.7$), and each of the plurality of second chalcogen layers may include $Sb_yTe_{1-y}$ ($0.2 \leq y \leq 0.8$).

In some embodiments, each semiconductor unit device may further include a heating electrode layer between the selection device layer and the at least part of the phase change material layer.

In some embodiments, the selection device layer may include a material having ovonic threshold switching characteristics.

In some embodiments, the semiconductor apparatus may further include a substrate. The plurality of semiconductor unit devices may include a first semiconductor unit device and a second semiconductor unit device spaced apart from each other on the substrate in a direction vertical to an upper surface of the substrate. The first semiconductor unit device and the second semiconductor unit device may be connected in common to the phase change material layer such that the first semiconductor unit device may include a first part of the phase change material layer and the second semiconductor unit device may include a second part of the phase change material layer.

In some embodiments, the semiconductor apparatus may further include a substrate. The plurality of semiconductor unit devices may include a first semiconductor unit device and a second semiconductor unit device spaced apart from each other on the substrate in a direction vertical to an upper surface of the substrate. The phase change material layer may include a first phase change material layer and a second phase change material layer spaced apart from each other in the direction vertical to the upper surface of the substrate. The first semiconductor unit device may include the first phase change material layer, and the second semiconductor unit device may include the second phase change material layer.

BRIEF DESCRIPTION OF THE DRAWINGS

The above and other aspects, features, and effects of certain embodiments of the disclosure will be more apparent from the following description taken in conjunction with the accompanying drawings, in which.

DETAILED DESCRIPTION

Figure 1:
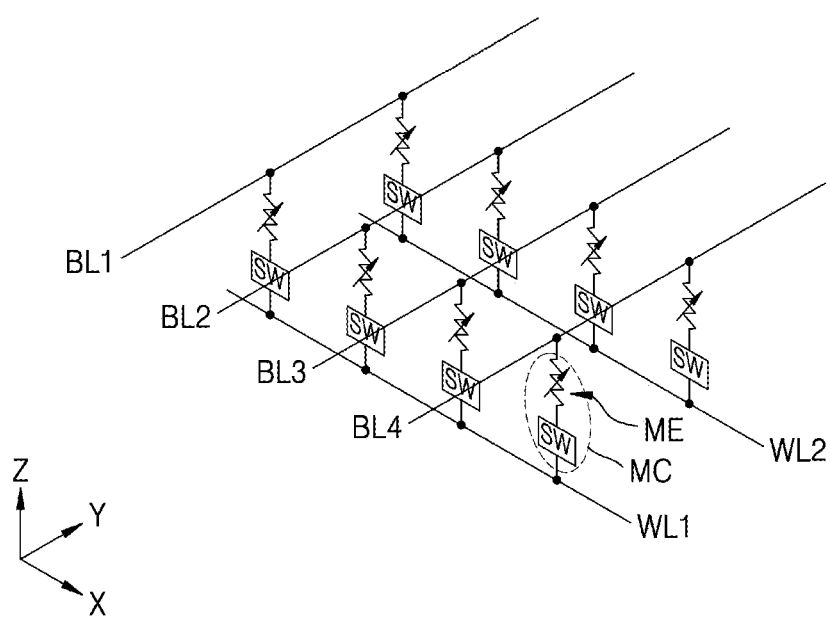
FIG. 1 is an equivalent circuit diagram illustrating a semiconductor apparatus including a plurality of semiconductor unit devices.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

In the following description, terms are used only for explaining specific embodiments while not limiting the scope of the present disclosure. When an element is referred to as being "above" or "on" another element, it may be directly on an upper, lower, left, or right side of the other element while making contact with the other element or may be above an upper, lower, left, or right side of the other element without making contact with the other element.

The terms of a singular form may include plural forms unless otherwise mentioned. Unless otherwise mentioned, the terms "comprises" and/or "comprising" used herein specify the presence of stated features, numbers, steps, processes, elements, components, materials, or combinations thereof but do not preclude the presence or addition of one or more other features, numbers, steps, processes, elements, components, materials, or combinations thereof.

Although terms such as "first," "second," and "third" are used to describe various elements, the terms are only used to distinguish one element from other elements, and the features of the elements such as order and type should not be limited by the terms. In addition, terms such as "unit," "means," "module," or "part" may be used to denote a unit of a comprehensive structure that has at least one function or operation and is implemented with hardware, software, or a combination of hardware and software.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Hereinafter, embodiments will be described with reference to the accompanying drawings. In the drawings, like reference numerals refer to like elements, and the sizes of elements (such as the widths and thicknesses of layers or regions) may be exaggerated for clarity of illustration. The embodiments described herein are for illustrative purposes only, and various modifications may be made therein.

According to an aspect, a semiconductor apparatus may have a three-dimensional structure in which two separate electrode lines have a cross point, and the semiconductor apparatus may include a semiconductor unit device having a variable resistance layer and a selection device layer, which are electrically connected to each other at the cross point. Such semiconductor devices and/or semiconductor apparatuses may be memory devices.

FIG. 1 is an equivalent circuit diagram illustrating a semiconductor apparatus 100 including a plurality of semiconductor unit devices MC according to an embodiment. Referring to FIG. 1, the semiconductor apparatus 101 may include a plurality of first electrode lines WL1 and WL2 extending parallel to each other in a first direction (X direction). In addition, the semiconductor apparatus 101 may include second electrode lines BL1, BL2, BL3, and BL4 spaced apart from the first electrode lines WL1 and WL2 in a third direction (Z direction) and extending parallel to each other in a second direction (Y direction). The semiconductor unit devices MC may be arranged between the first electrode lines WL1 and WL2 and the second electrode lines BL1, BL2, BL3 and BL4. For example, the semiconductor unit devices MC may be respectively arranged at cross points between the first electrode lines WL1 and WL2 and the second electrode lines BL1, BL2, BL3, and BL4 and may be electrically connected to the first electrode lines WL1 and WL2 and the second electrode lines BL1, BL2, BL3, and BL4. In addition, each of the semiconductor unit devices MC may include a phase change material layer ME and a selection device layer SW that are electrically connected to each other. For example, the phase change material layer ME and the selection device layer SW may be connected in series to each other in the third direction (Z direction), wherein the selection device layer SW may be electrically connected to the first electrode lines WL1 and WL2 or the second electrode lines BL1, BL2, BL3, and BL4, and the phase change material layer ME may be electrically connected to the other electrode lines.

Briefly, the semiconductor apparatus 101 may be driven by applying a voltage to the phase change material layer ME of the semiconductor unit devices MC through the first electrode lines WL1 and WL2 and the second electrode lines BL1, BL2, BL3, and BL4 in order to induce an electrical current flow. For example, a certain semiconductor unit device MC may be addressed by selectively choosing the first electrode lines WL1 and WL2 and the second electrode lines BL1, BL2, BL3, and BL4, and the semiconductor unit device MC may be programmed by applying a signal between the chosen electrode lines of the first electrode lines WL1 and WL2 and the second electrode lines BL1, BL2, BL3, and BL4. In addition, information which depends on the resistance value of the phase change material layer ME of the semiconductor unit device MC, that is, programmed information, may be read by measuring a current value through the second electrode lines BL1, BL2, BL3, and BL4.

The selection device layer SW may have a function of selecting (addressing) a certain semiconductor unit device MC by controlling the flow of current to the semiconductor unit devices MC electrically connected to the selection device layer SW.

The phase change material layer ME may have a function of storing information. For example, the resistance of the phase change material layer ME may vary according to a voltage applied thereto. The semiconductor unit device MC may store and erase digital information such as "0" or "1" according to variations in the resistance of the phase change material layer ME. The semiconductor unit device MC may write data, for example, by writing a high resistance state of the phase change material layer ME as "0" and a low resistance state of the phase change material layer ME as "1." Here, writing from the high resistance state "0" to the low resistance state "1" may be referred to as a "set operation," and writing from the low resistance state "1" to the high resistance state "0" may be referred to as a "reset operation."

The phase change material layer ME may include a phase change material of which the phase is reversibly changeable according to the temperature thereof. In other words, the phase change material layer ME may include a phase change material which is reversibly changeable in phase under the influence of Joule heating that occurs when electrical pulses are applied from the outside to the phase change material and thus the phase change material layer ME may have resistance that varies with such a reversible phase change.

The phase change material layer ME may include a chalcogen compound having a superlattice-like structure. A phase change material layer known in the related art is a Ge—Sb—Te (GST) alloy, which is changeable between crystalline and amorphous phases according to the time of heating (the amount of heat applied thereto) and thus has electrical resistance variable with such a phase change. However, compared to the Ge—Sb—Te (GST) alloy, the chalcogen compound having a superlattice-like structure may have lower power consumption and/or may be applied for high-speed driving of semiconductor apparatuses. For example, when a superlattice-like structure is formed by alternately stacking a first chalcogen layer containing Ge—Te and a second chalcogen layer containing Sb—Te, a change into the inverted Petrov phase, the Kooi phase, or the like may occur as bonding of Ge changes at the interface between the two chalcogen layers, and as a result, electrical resistance may vary (Adv. Mater. Interfaces 2014, 1, 1300027). Such chalcogen materials may be phase-changed with less energy and within a shorter time than the Ge—Sb—Te (GST) alloy.

Furthermore, semiconductor apparatuses such as the semiconductor apparatus 100 shown in FIG. 1, in which a plurality of semiconductor unit devices MC are apart from each other on the X-Y plane, may require a larger area as the number of semiconductor unit devices increases and may be difficult to cope with the trend of miniaturization due to a limited minimum feature size.

To address this, an embodiment provides a semiconductor apparatus which may be driven with low power at a high speed because a phase change material layer ME includes a chalcogen compound having a superlattice-like structure, and which may be highly integrated because a plurality of semiconductor unit devices MC are separately arranged along a Z axis.

Figure 2:
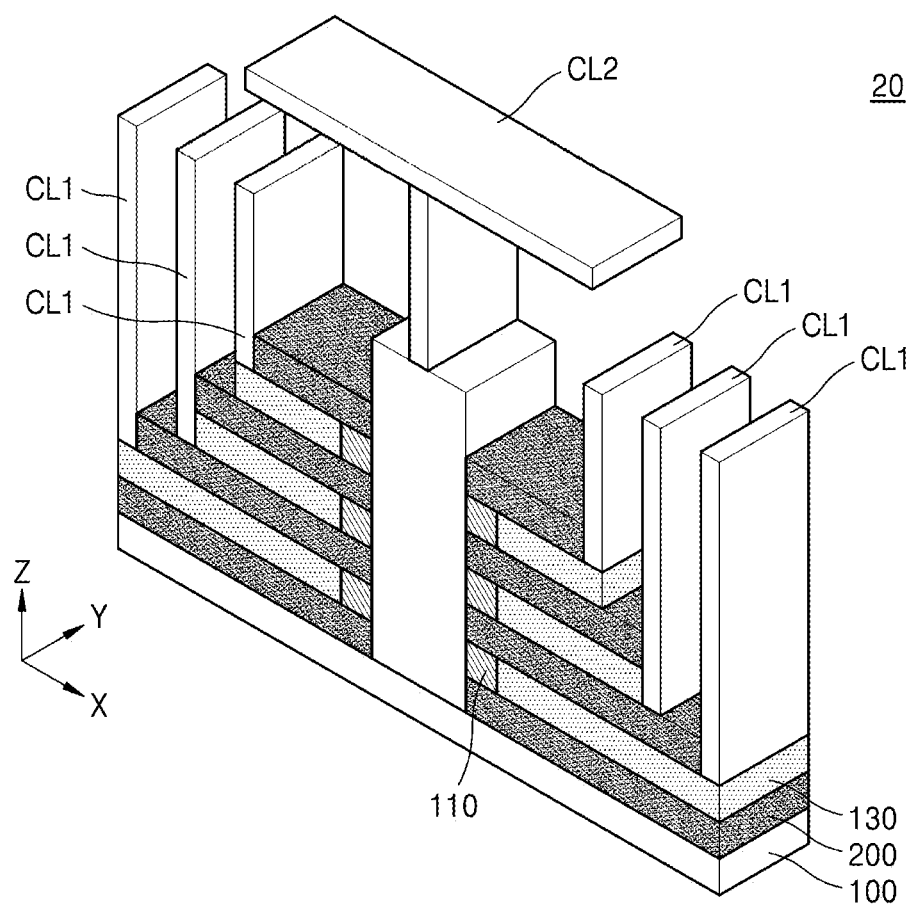
FIG. 2 is a perspective view illustrating a semiconductor apparatus according to an embodiment.

FIG. 2 is a perspective view illustrating a semiconductor apparatus 20 according to an embodiment. Referring to FIG. 2, in the semiconductor apparatus 20, a selection device layer 130 and a phase change material layer 110 may be arranged side by side on an X-Y plane to form a semiconductor unit device and such semiconductor unit devices may be arranged while being separated from each other by first insulating layers 200 in a direction (Z direction) perpendicular to a substrate 100.

Figure 3A:
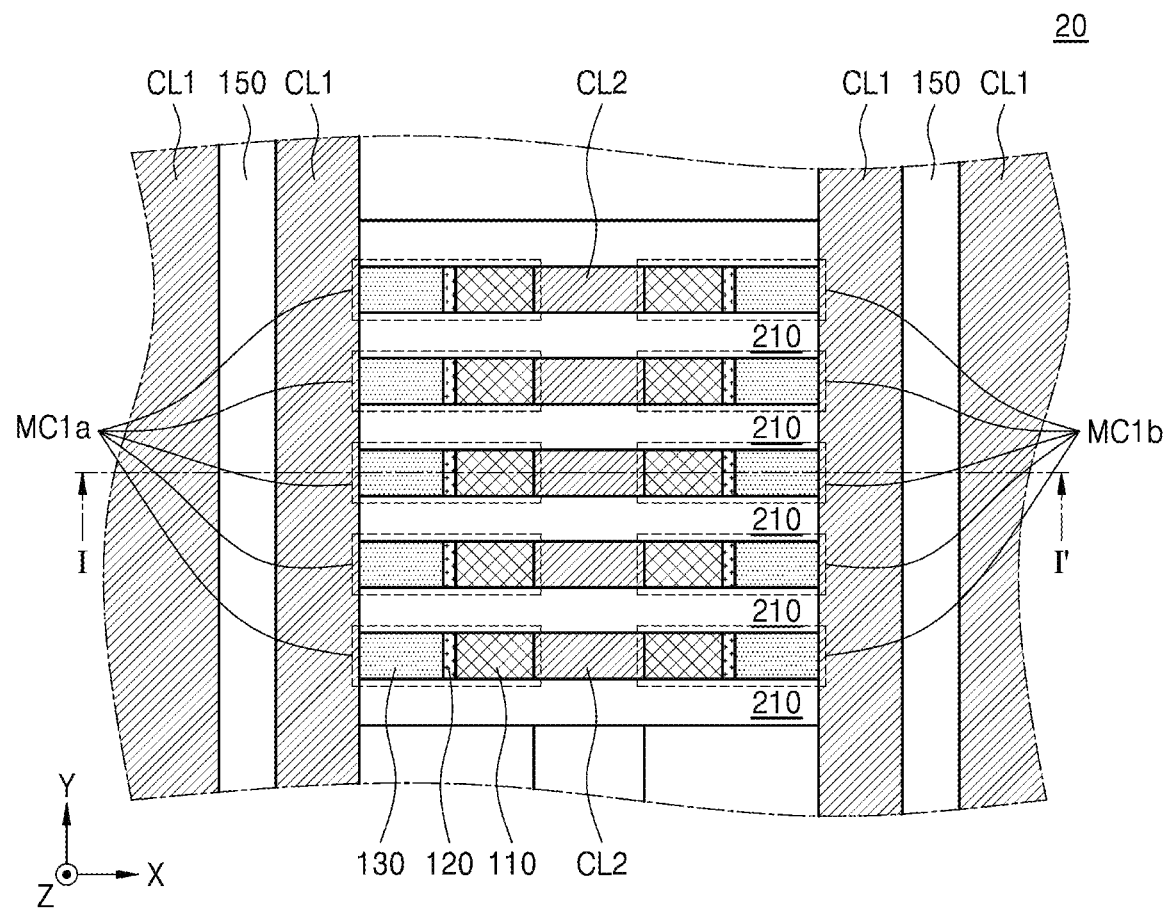
FIG. 3A is a plan view illustrating a semiconductor apparatus according to an embodiment.
Figure 3B:
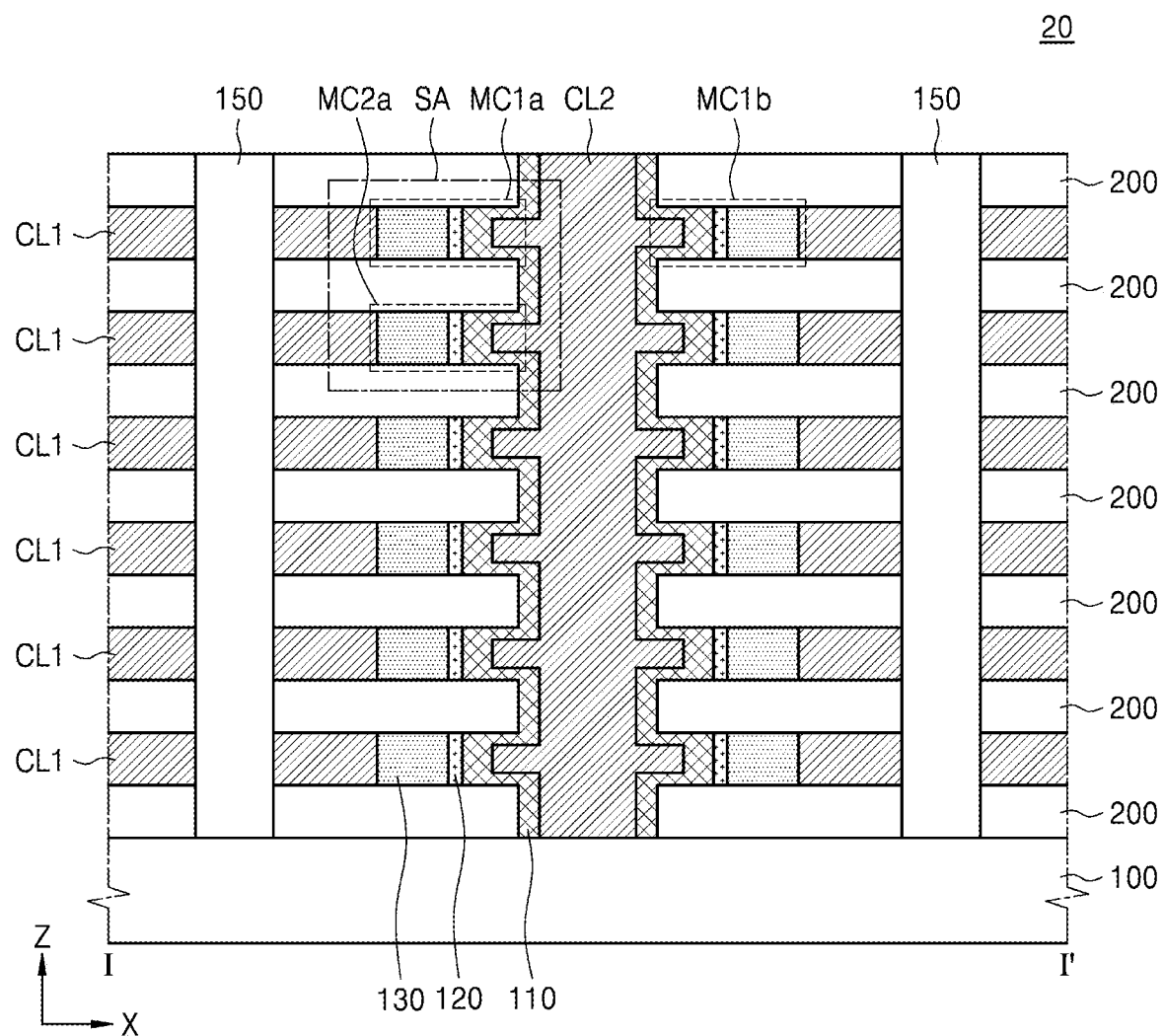
FIG. 3B is a cross-sectional view taken along the line I-I' of FIG. 3A.
Figure 3C:
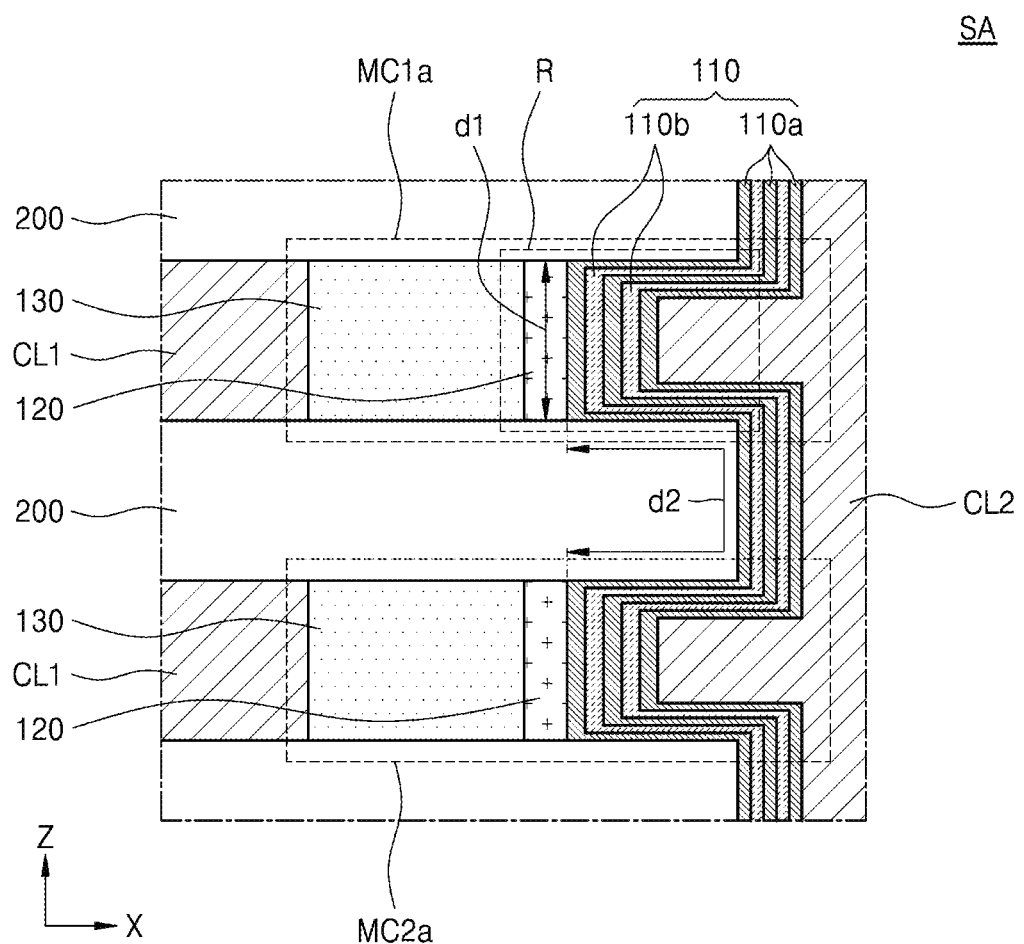
FIG. 3C is an enlarged view schematically illustrating a region SA of FIG. 3B.

FIG. 3A is a plan view illustrating a semiconductor apparatus 20 according to an embodiment, FIG. 3B is a cross-sectional view taken along line I-I' of FIG. 3A, and FIG. 3C is an enlarged view schematically illustrating a region SA of FIG. 3B. Referring to FIGS. 3A and 3B, the semiconductor apparatus 20 may include semiconductor unit devices MC1a, MC1b, and MC2a, wherein the semiconductor unit devices MC1a and MC2a may be apart from each other in a Z direction with a first insulating layer 200 therebetween, the semiconductor unit devices MC1a and MC1b may be apart from each other on an X-Y plane with a second insulating layer 210 therebetween, and each of the semiconductor unit devices MC1a, MC1b, and MC2a may include a selection device layer 130 and a phase change material layer 110, which are arranged in a direction (X direction) parallel to a substrate 100.

In addition, referring to FIG. 3C, the phase change material layer 110 may include: a first chalcogen layer 110a including Ge—Te and a second chalcogen layer 110b including Sb—Te. The first chalcogen layer 110a and the second chalcogen layer 110b may form a superlattice-like structure. For example, the first chalcogen layer 110a and the second chalcogen layer 110b may be alternately arranged one or more times in a direction (X direction) parallel to the substrate 100. For example, the phase change material layer 110 may be expressed as $(A_mB_{1-m})_n$. In $(A_mB_{1-m})_n$, A refers to the first chalcogen layer 110a, B refers to the second chalcogen layer 110b, 0<m<1, and n refers to the number of arrangements of the first chalcogen layer 110a and the second chalcogen layer 110b. The number (n) of arrangements of the first chalcogen layer 110a and the second chalcogen layer 110b may be 1.5 or more, 2 or more, 2.5 or more, 3 or more, 200 or less, 150 or less, 130 or less, 100 or less, 95 or less, or 90 or less.

The first chalcogen layer 110a may include a compound represented by $Ge_xTe_{1-x}$ ($0.3 \leq x \leq 0.7$), and the second chalcogen layer 110b may include a compound represented by $Sb_yTe_{1-y}$ ($0.2 \leq y \leq 0.8$). In addition, the first chalcogen layer 110a and/or the second chalcogen layer 110b may each independently further include at least one dopant material selected from the group consisting of carbon (C), nitrogen (N), indium (In), zinc (Zn), Scandium (Sc), and tin (Sn).

The phase change material layer 110 may have a thickness of about 30 nm or more, about 35 nm or more, about 40 nm or more, about 100 nm or less, about 95 nm or less, about 90 nm or less, about 85 nm or less, or about 80 nm or less in the direction (X direction) parallel to the substrate 100. In addition, the first chalcogen layer 110a and the second chalcogen layer 110b may each independently have a thickness of about 1 nm or more, about 2 nm or more, about 3 nm or more, about 5 nm or more, about 20 nm or less, about 15 nm or less, or about 10 nm or less.

In addition, the first chalcogen layer 110a and/or the second chalcogen layer 110b may each have an electron carrier path therein. Therefore, because the semiconductor unit devices MC1a and MC2a arranged adjacent to each other in a vertical direction (Z direction) share the first chalcogen layer 110a and/or the second chalcogen layer 110b, cross-talk may occur between the semiconductor unit devices MC1a and MC2a.

Thus, in an embodiment, the semiconductor apparatus 20 is configured such that transfer of electrons in the phase change material layer 110 between the semiconductor unit devices MC1a and MC2a adjacent to each other may be minimized or prevented (and/or limited).

According to an embodiment, as shown in FIG. 3C, each selection device layers 130 may be arranged between two first insulating layers 200 to form a recess portion R while covering portions of surfaces of the two first insulating layers 200, and the phase change material layer 110 may be arranged along the recess portion R to cover the two first insulating layers 200 and the selection device layer 130. The length d2 of a surface of the phase change material layer 110, which is adjacent to each first insulating layer 200, may be equal to or greater than the length d1 of a surface of the phase change material layer 110, which is adjacent to each selection device layer 130, and thus cross-talk between the semiconductor unit devices MC1a and MC2a adjacent to each other may be minimized. For example, the length d2 of the surface of the phase change material layer 110, which is adjacent to each first insulating layer 200, may be greater than the length d1 of the surface of the phase change material layer 110, which is adjacent to each selection device layer 130 by a factor of greater than about 1.0 or more, or by a factor of about 1.5 or more, about 2.0 or more, about 5.0 or less, about 4.5 or less, or about 4.0 or less.

Figure 4:
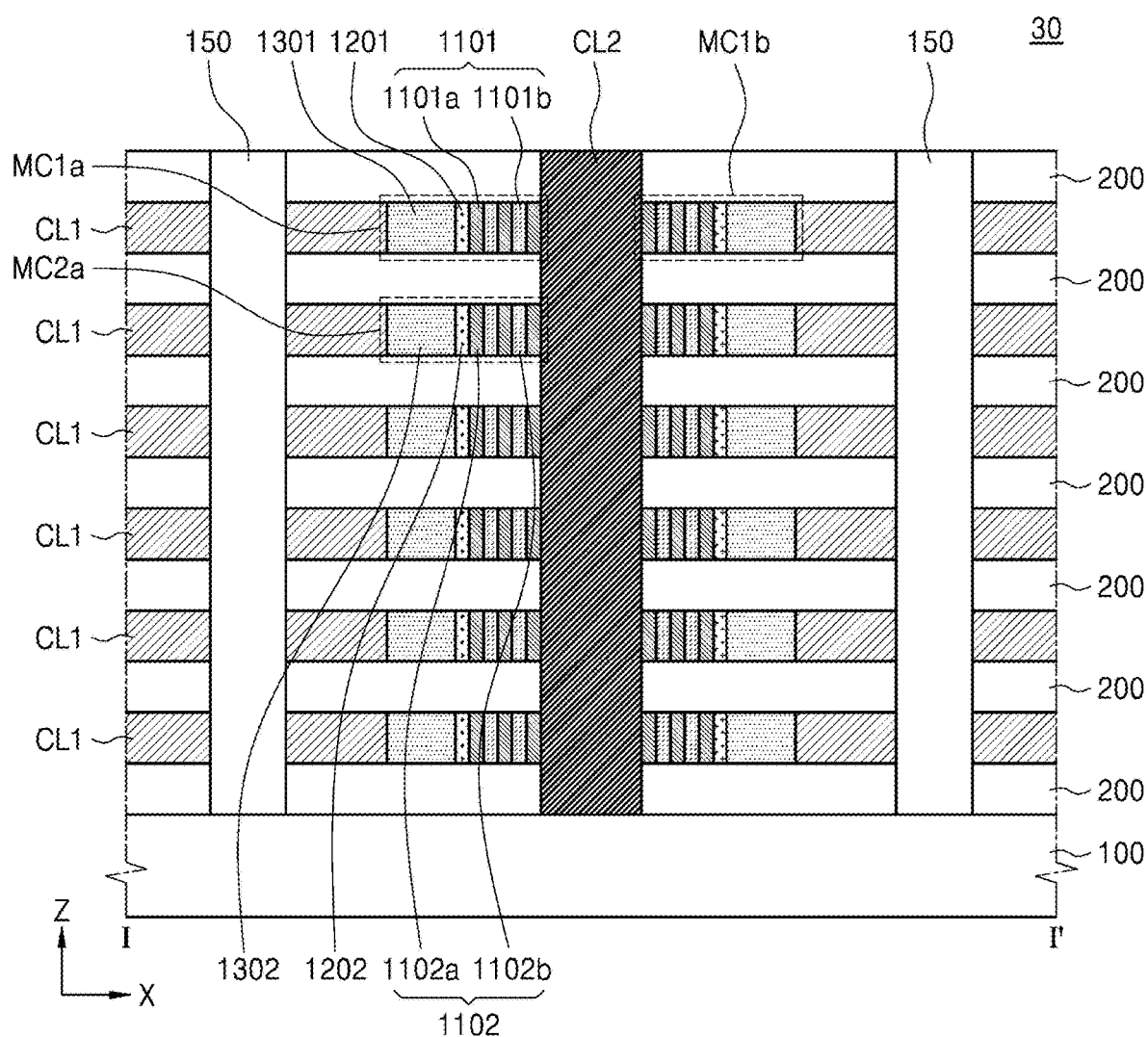
FIG. 4 is a cross-sectional view illustrating a semiconductor apparatus according to an embodiment.

In a semiconductor apparatus according to another embodiment, first and second chalcogen layers may be electrically insulated by a first insulating layer. FIG. 4 illustrates a semiconductor apparatus 30 according to another embodiment.

Referring to FIG. 4, the semiconductor apparatus 30 may include: a first semiconductor unit device MC1a including a first selection device layer 1301 and a first phase change material layer 1101, which extend side by side in a direction parallel to a substrate 100; and a second semiconductor unit device MC2a including a second selection device layer 1302 and a second phase change material layer 1102, which extend side by side in the direction parallel to the substrate 100, wherein the first semiconductor unit device MC1a and the second semiconductor unit device MC2a may be apart from each other with a first insulating layer 200 therebetween in a direction normal to the substrate 100. The first phase change material layer 1101 and the second phase change material layer 1102 may include first chalcogen layers 1101a and 1102a and second chalcogen layers 1101b and 1102b, which extend in the direction parallel to the substrate 100. The first phase change material layer 1101 and the second phase change material layer 1102 are physically separated from each other and are electrically insulated from each other by the first insulating layer 200 such that transfer of electrons between the first and second semiconductor unit devices MC1a and MC2a may be prevented. The thickness of the first insulating layer 200 may be about 5 nm or more, about 10 nm or more, about 15 nm or more, about 50 nm or less, about 45 nm or less, about 40 nm or less, about 35 nm or less, or about 30 nm or less.

Referring back to FIG. 3C, the selection device layer 130 may include a material of which the resistance is variable according to the magnitude of voltage applied between both ends of the selection device layer 130. For example, the selection device layer 130 may include a p-n junction, or may include a mixed ion-electron conductor (MIEC) or a Mott transition device. According to an embodiment, the selection device layer 130 may include a diode. For example, the diode may have a junction structure (not shown) in which materials having different conductivity types extend side by side in a direction parallel to the substrate 100. For example, the diode may have an N-type and a P-type as conductivity types, wherein one of the N-type and P-type may be arranged adjacent to a first electrode CL1, and the other of the N-type and P-type may be arranged adjacent to the phase change material layer 110 and/or a second electrode CL2. The selection device layer 130 may include a silicon diode in which P—Si and N—Si are bonded to each other. Alternatively, the selection device layer 130 may include an oxide diode in which P—NiO$_x$ and N—TiO$_x$ are bonded to each other or P—CuO$_x$ and N—TiO$_x$ are bonded to each other.

According to another embodiment, the selection device layer 130 may have ovonic threshold Switching (OTS) characteristics.

Figure 5:
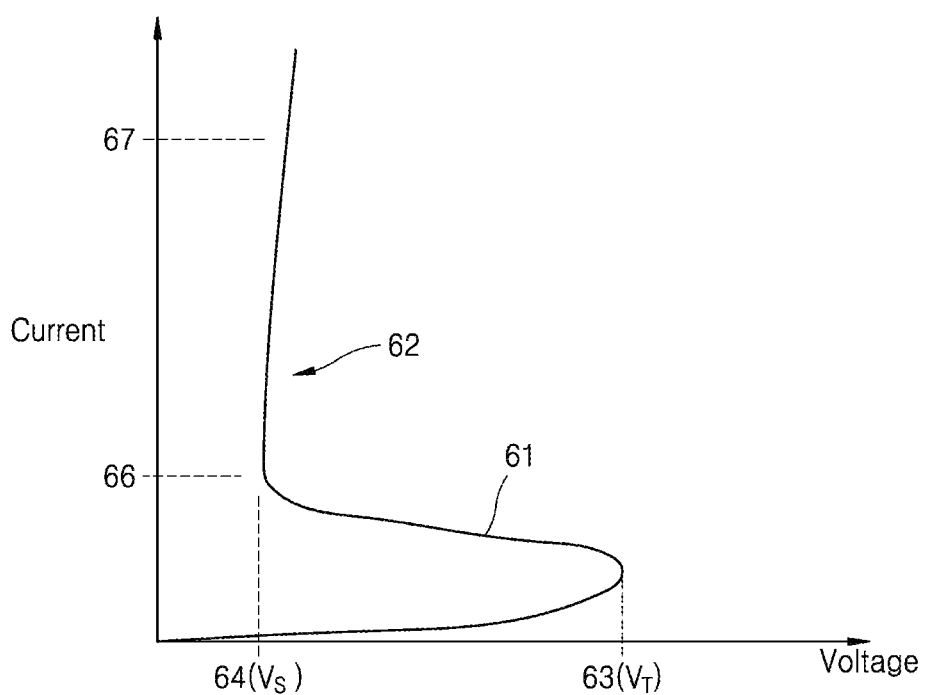
FIG. 5 is a graph schematically illustrating a voltage-current curve of a material having ovonic threshold switching characteristics.

FIG. 5 is a graph schematically illustrating a voltage-current curve of the selection device layer 130 having ovonic threshold switching characteristics. Referring to FIG. 5, a first curve 61 shows a voltage-current relationship in a state in which little current flows through the selection device layer 130. While voltage gradually increases from a state in which voltage and current are zero, the selection device layer 130 may stay in a high resistance state in which little current flows until the voltage reaches a threshold voltage VT (first voltage level 63). However, as soon as the voltage exceeds the threshold voltage VT, the selection device layer 130 may enter into a low resistance state in which current flowing through the selection device layer 130 increases rapidly, and the voltage applied to the selection device layer 130 may decrease to a saturation voltage Vs (second voltage level 64). A second curve 62 shows a voltage-current relationship in a state in which current flows smoothly through the selection device layer 130. As the current flowing through the selection device layer 130 becomes greater than a first current level 66, the voltage applied to the selection device layer 130 may slightly increase from the second voltage level 64. For example, while the current flowing through the selection device layer 130 increases significantly from the first current level 66 to a second current level 67, the voltage applied to the selection device layer 130 may slightly increase from the second voltage level 64. In other words, once current flows through the selection device layer 130, the voltage applied to the selection device layer 130 may be maintained at a level substantially equal to the saturation voltage Vs. When the current decreases below a holding current level (first current level 66), the selection device layer 130 returns to the high resistance state such that current may be effectively blocked until the voltage increases again to the threshold voltage VT. Owing to this, the selection device layer 130 may have switching characteristics with a threshold voltage VT at the first voltage level 63.

The selection device layer 130 having ovonic threshold switching characteristics may include: a first element including germanium (Ge) and/or tin (Sn); a second element including arsenic (As), antimony (Sb), and/or bismuth (Bi); and a third element including sulfur (S), selenium (Se), and/or tellurium (Te)

The selection device layer 130 may include the first element in an amount of about 5.0 at % to about 30.0 at % based on a total element amount. For example, the selection device layer 130 may include the first element in an amount of about 7.0 at % or more, about 10.0 at % or more, about 25.0 at % or less, about 23.0 at % or less, or about 20.0 at % or less based on a total element amount.

The selection device layer 130 may include the second element in an amount of about 5.0 at % to about 50.0 at % based on a total element amount. For example, the selection device layer 130 may include the second element in an amount of about 7.0 at % or more, about 10.0 at % or more, about 15.0 at % or more, about 20.0 at % or more, about 45.0 at % or less, about 40.0 at % or less, or about 35.0 at % or less based on a total element amount.

The selection device layer 130 may include the third element in an amount of greater than about 0.0 at % to about 70.0 at % based on a total element amount. For example, the selection device layer 130 may include the third element in an amount of about 10.0 at % or more, about 15 at % or more, about 20.0 at % or more, about 25.0 at % or more, about 30.0 at % or more, about 35.0 at % or more, about 40.0 at % or more, about 65.0 at % or less, about 60.0 at % or less, or about 55.0 at % or less based on a total element amount.

The selection device layer 130 and the phase change material layer 110 may be electrically connected to each other. For example, a third electrode 120 may be further included between the selection device layer 130 and the phase change material layer 110. The third electrode 120 may include a metal, a conductive metal nitride, a conductive metal oxide, or a combination thereof. For example, the third electrode 120 may include at least one selected from the group consisting of carbon (C), titanium nitride (TiN), titanium silicon nitride (TiSiN), titanium carbon nitride (TiCN), titanium carbon silicon nitride (TiCSiN), titanium aluminum nitride (TiAlN), tantalum (Ta), tantalum nitride (TaN), tungsten (W), and tungsten nitride (WN).

In addition, a heating electrode (not shown) may be further included between the third electrode 120 and the phase change material layer 110. The heating electrode and the third electrode 120 may be formed in one piece or as separate layers. The heating electrode may include a conductive material capable of generating sufficient heat to change the phase of the phase change material layer 110 without reacting with the phase change material layer 110. The heating electrode may include a carbon-based conductive material. For example, the heating electrode may include TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, carbon (C), silicon carbide (SiC), silicon carbon nitride (SiCN), carbon nitride (CN), titanium carbon nitride (TiCN), tantalum carbon nitride (TaCN), or a combination thereof.

The third electrode 120 may have a thickness such that heat generated by the heating electrode (not shown) may not substantially affect the selection device layer 130. In addition, the third electrode 120 may further include a thermal barrier layer, and may have a structure in which the thermal barrier layer and an electrode material layer are alternately stacked. The third electrode 120 may have a thickness of about 10 nm to about 100 nm.

The first electrode CL1 and the second electrode CL2 may be arranged on both ends of the semiconductor unit devices MC1a and MC2a. For example, the first electrode CL1 may be electrically connected to the selection device layer 130, and the second electrode CL2 may be electrically connected to the phase change material layer 110.

First electrodes CL1 may extend parallel to each other in the X direction, and each of the first electrodes CL1 may be arranged between two first insulating layers 200. In addition, second electrodes CL2 may extend parallel to each other in the Z direction, and each of the second electrodes CL2 may be arranged between two second insulating layers 210. In terms of driving the semiconductor apparatus 20 or 30, the first electrode CL1 may be connected to one of a word line and a bit line, and the second electrode CL2 may be connected to the other. One or both of the first electrode CL1 and the second electrode CL2 may each be a common electrode of the semiconductor unit devices MC1a, MC1b, and MC2a. For example, referring to FIGS. 3A and 3B, the first electrodes CL1 may extend in the Y direction between the first insulating layers 200, which are apart from each other in the Z direction, and each of the first electrodes CL1 may be commonly connected to a plurality of semiconductor unit devices MC1a or MC1b arranged at the same level. In addition, the second electrodes CL2 may extend in the Z direction between the second insulating layers 210, which are apart from each other in the Y direction, and each of the second electrodes CL2 may be commonly connected to a plurality of semiconductor unit devices MC1a, MC1b, and MC2a arranged at the same level.

Each of the semiconductor apparatuses 20 and 30 may include the substrate 100. For example, the substrate 100 may include a semiconductor material such as silicon (Si), germanium (Ge), silicon germanium (SiGe), silicon carbide (SiC), gallium arsenide (GaAs), indium arsenide (InAs), or indium phosphide (InP), and the substrate 100 may include an insulating material such as silicon oxide, silicon nitride, or silicon oxynitride.

Each of the semiconductor apparatuses 20 and 30 may further include an interlayer insulating layer (not shown) on the substrate 100. The interlayer insulating layer (not shown) may be arranged between the substrate 100 and the first electrode CL1 and/or the second electrode CL2 to electrically separate the substrate 100 from the first electrode CL1 and/or the second electrode CL2. The interlayer insulating layer (not shown) may include an oxide such as silicon oxide and/or a nitride such as silicon nitride.

Each of the semiconductor apparatuses 20 and 30 may further include an isolation insulating layer 150. Referring to FIG. 3B, the isolation insulating layer 150 may be in contact with an upper surface of the substrate 100 and may extend in the Z direction from the upper surface of the substrate 100. The isolation insulating layer 150 may be formed through the first electrodes CL1 and the first insulating layers 200. Referring to FIG. 3A, isolation insulating layers 150 may extend along sides of the first electrodes CL1 or in the Y direction at both sides of each of the second insulating layers 210, or each of the isolation insulating layers 150 may be arranged between two first electrodes CL1, which are adjacent to each other in the X direction.

Each of the semiconductor apparatuses 20 and 30 may further include a driving circuit region (not shown) on the substrate 100. The driving circuit region may include circuit units such as a peripheral circuit, a driving circuit, and a core circuit configured to drive the semiconductor unit devices or perform arithmetic processing. The circuits may include, for example, a page buffer, a latch circuit, a cache circuit, a column decoder, a sense amplifier, a data in/out circuit, or a row decoder. In addition, the circuits may be arranged between the substrate 100 and the semiconductor unit devices. In other words, the driving circuit region and the semiconductor unit devices may be sequentially arranged on the substrate 100, and this arrangement structure may be a cell-on-peri (COP) structure.

The driving circuit region may include one or more transistors and wiring structures, which are electrically connected to the transistors. The transistors may be arranged in active regions of the substrate 100, which are defined by a device isolation layer. Each of the transistors may include a gate, a gate insulating layer, and a source/drain. In addition, insulating spacers may be arranged on both sidewalls of the gate, and an etch stop layer may be arranged on the gate and/or the insulating spacers. The etch stop layer may include an insulating material such as silicon nitride or silicon oxynitride.

The number and positions of wiring structures may be determined according to the layout of the driving circuit region and the type and arrangement of the gates. The wiring structures may have a multilayer structure having two or more layers. For example, each of the wiring structures may include a contact and a wiring layer, which are electrically connected to each other and are sequentially stacked on the substrate 100. The contact and the wiring layer may each independently include a metal, a conductive metal nitride, a metal silicide, or a combination thereof, and may include a conductive material such as tungsten, molybdenum, titanium, cobalt, tantalum, nickel, tungsten silicide, titanium silicide, cobalt silicide, tantalum silicide, or nickel silicide.

The wiring structures may include interlayer insulating layers, which electrically separate components from each other. The interlayer insulating layers may be arranged between a plurality of transistors, between a plurality of wiring layers, and/or between a plurality of contacts. The interlayer insulating layers may include silicon oxide, silicon nitride, silicon oxynitride, or the like.

The semiconductor apparatuses 20 and 30 may be manufactured by general methods which are known in the art.

FIGS. 6A to 6G are cross-sectional views illustrating some processes of manufacturing a semiconductor apparatus according to an embodiment.

Figure 6A:
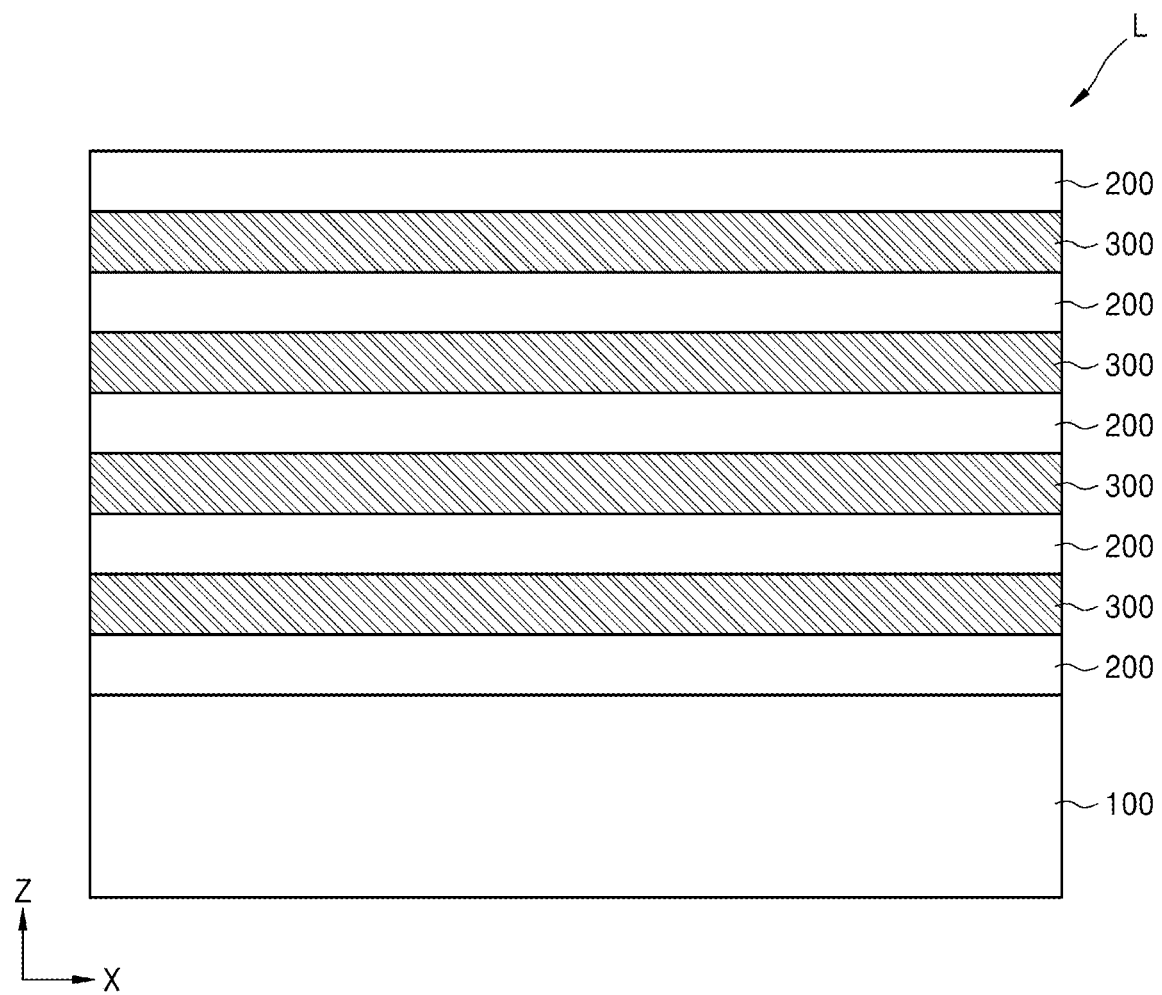
FIGS. 6A to 7E are cross-sectional views illustrating processes of manufacturing a semiconductor apparatus according to an embodiment.

Referring to FIG. 6A, a structure L is formed by alternately stacking a first insulating layer 200 and a sacrificial layer 300 on a substrate 100. Thus, first insulating layers 200 may be arranged on a surface of the substrate 100 and the uppermost portion of the structure L.

Figure 6B:
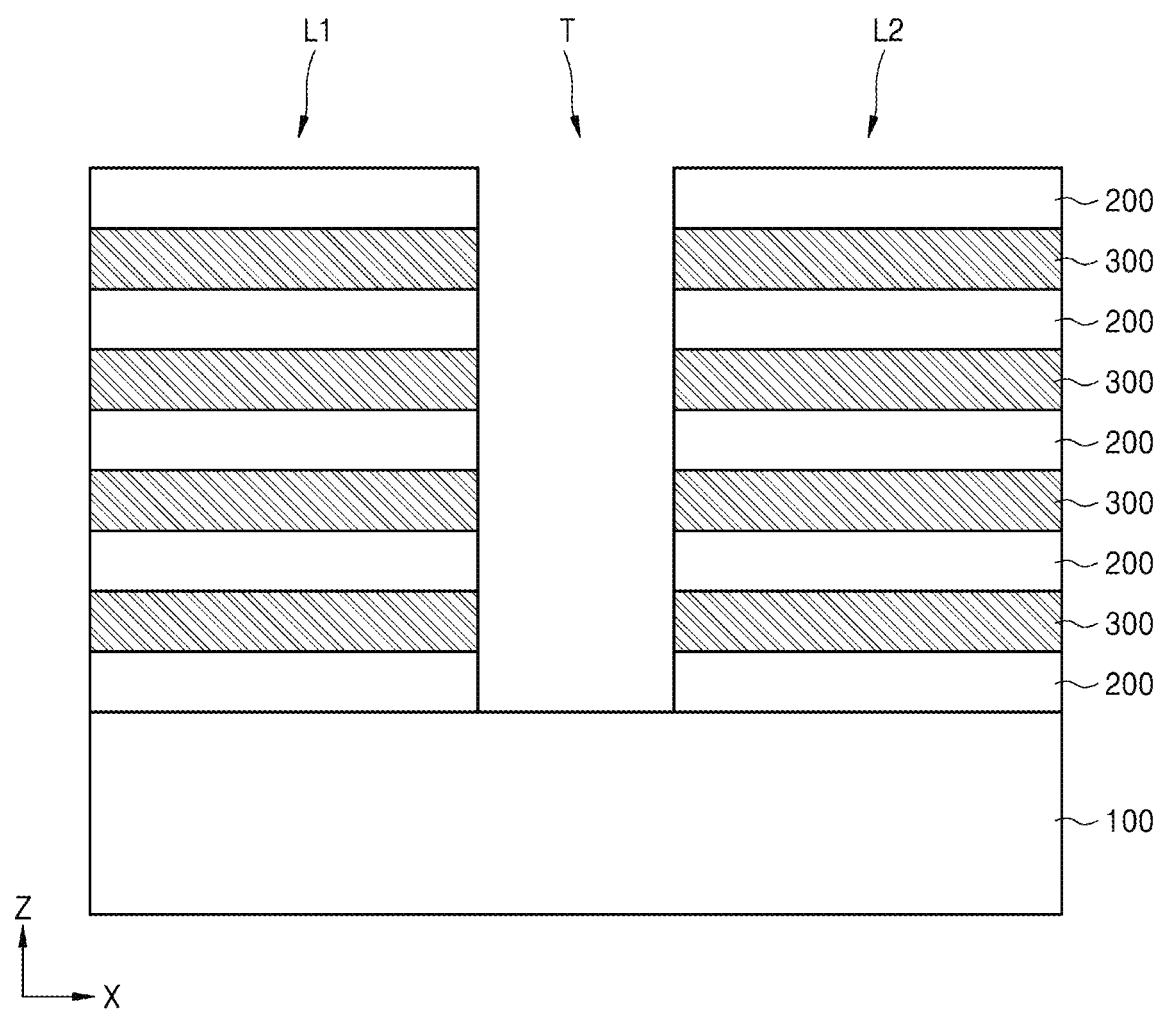

Referring to FIG. 6B, a vertical trench T is formed through the structure L in the Z direction. Thus, substructures L1 and L2 may be formed on both sides of the vertical trench T.

Figure 6C:
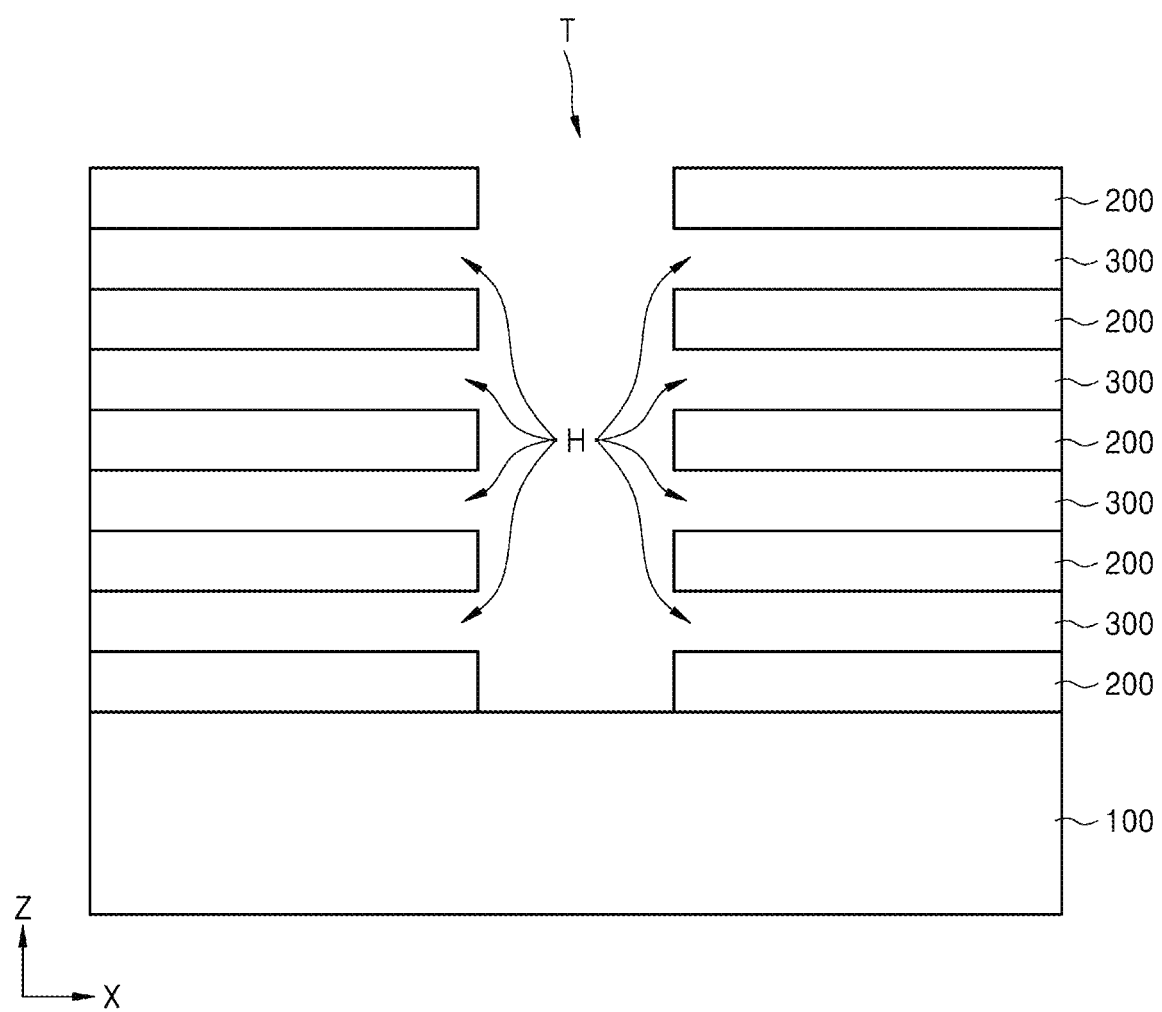

Referring to FIG. 6C, sacrificial layers 300 are selectively removed to form a horizontal hole H between every two first insulating layers 200 in an X direction.

Figure 6D:
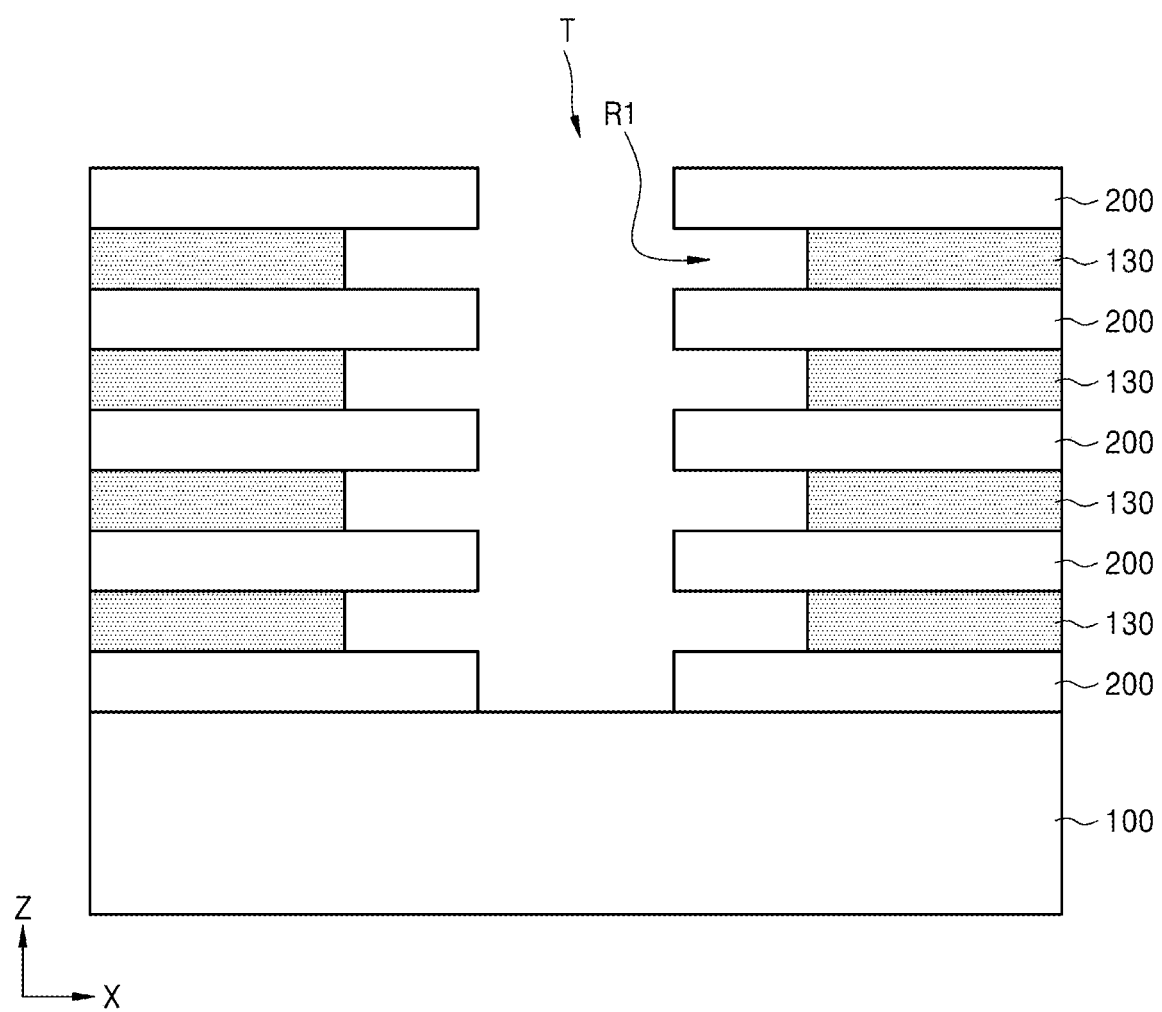

Referring to FIG. 6D, selection device layers 130 are formed in portions of the horizontal holes H. Each of the selection device layers 130 may form a first recess portion R1 together with two first insulating layers 200.

Figure 6E:
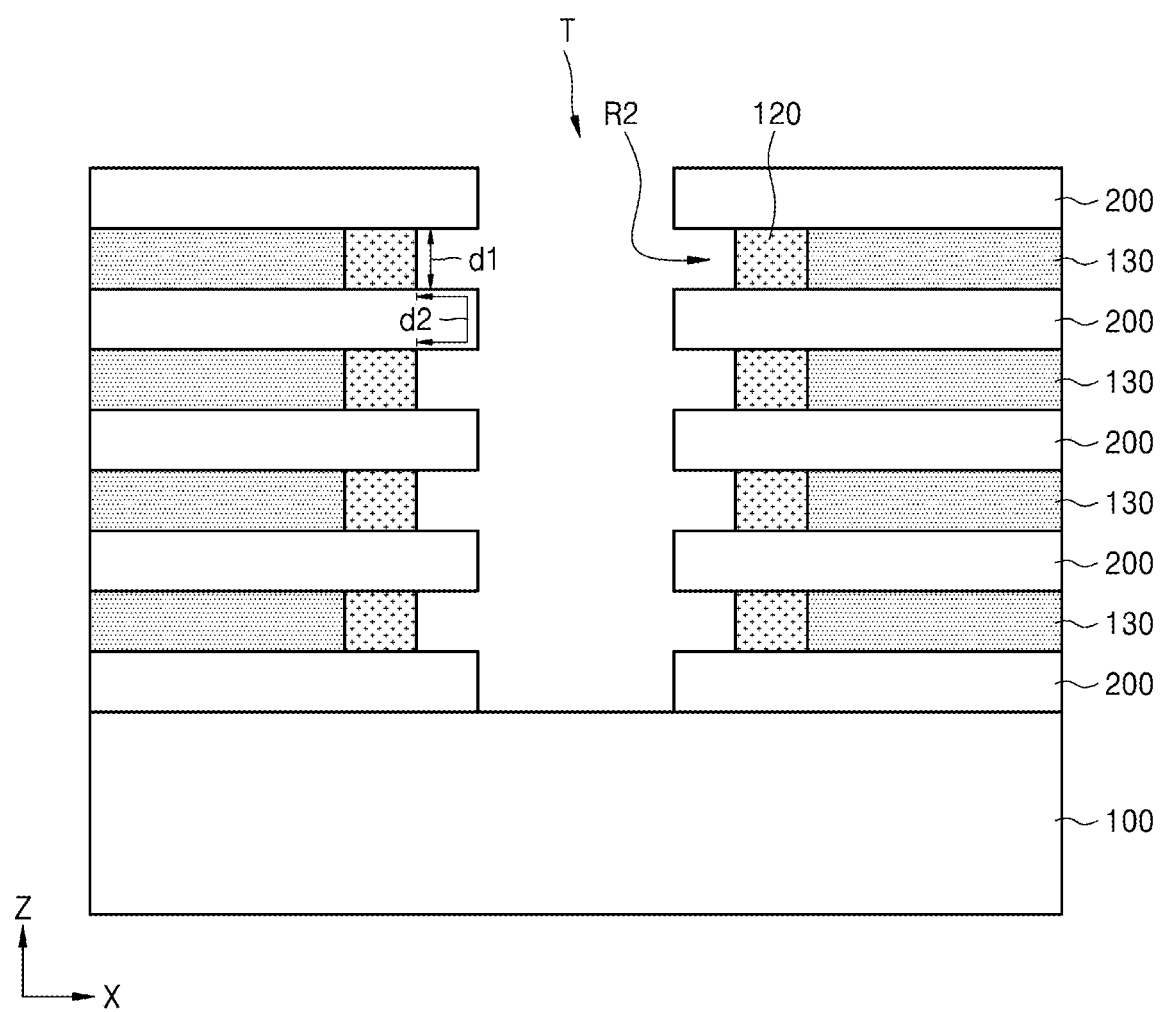

Referring to FIG. 6E, third electrodes 120 are formed in the remaining portions of the horizontal holes H. Each of the third electrodes 120 may extend in a direction parallel to the selection device layers 130 and the substrate 100 and may form a second recess portion R2 together with two first insulating layers 200. The length d2 of a portion of each of the first insulating layers 200, which is exposed in the vertical trench T and horizontal holes H may be greater than the length d1 of each of the second recesses R2 between two first insulating layers 200. For example, the length d2 of the portion of the first insulating layer 200 exposed in the vertical trench T and the horizontal holes H may be greater than the length d1 between two first insulating layers 200 by a factor of greater than about 1.0 or more, or by a factor of about 1.5 or more, about 2.0 or more, about 5.0 or less, about 4.5 or less, or about 4.0 or less.

Figure 6F:
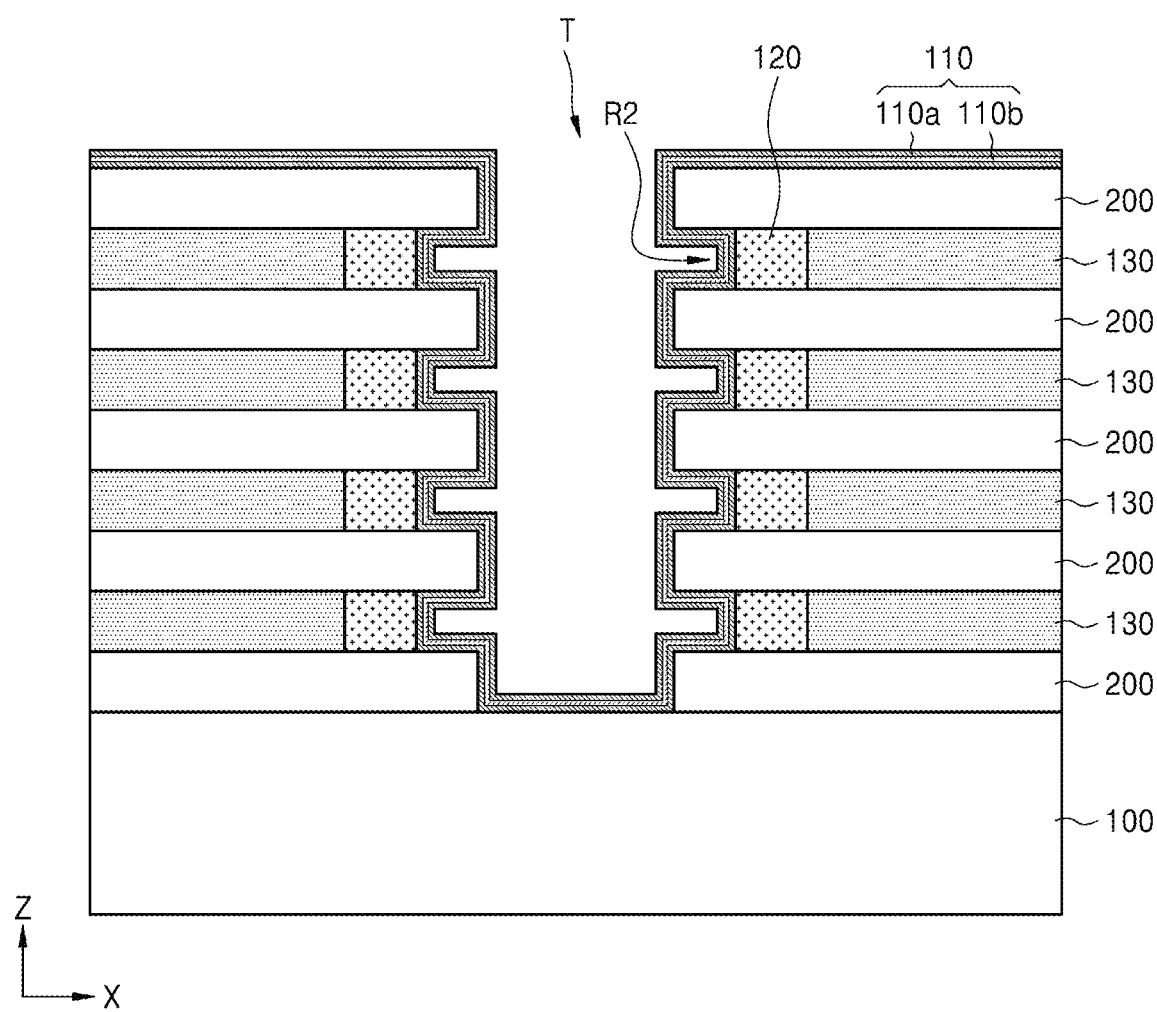

Referring to FIG. 6F, a phase change material layer 110 is formed along sidewalls of the horizontal holes H and the vertical trench T. The phase change material layer 110 may be formed by alternately stacking a first chalcogen layer 110a and a second chalcogen layer 110b.

Figure 6G:
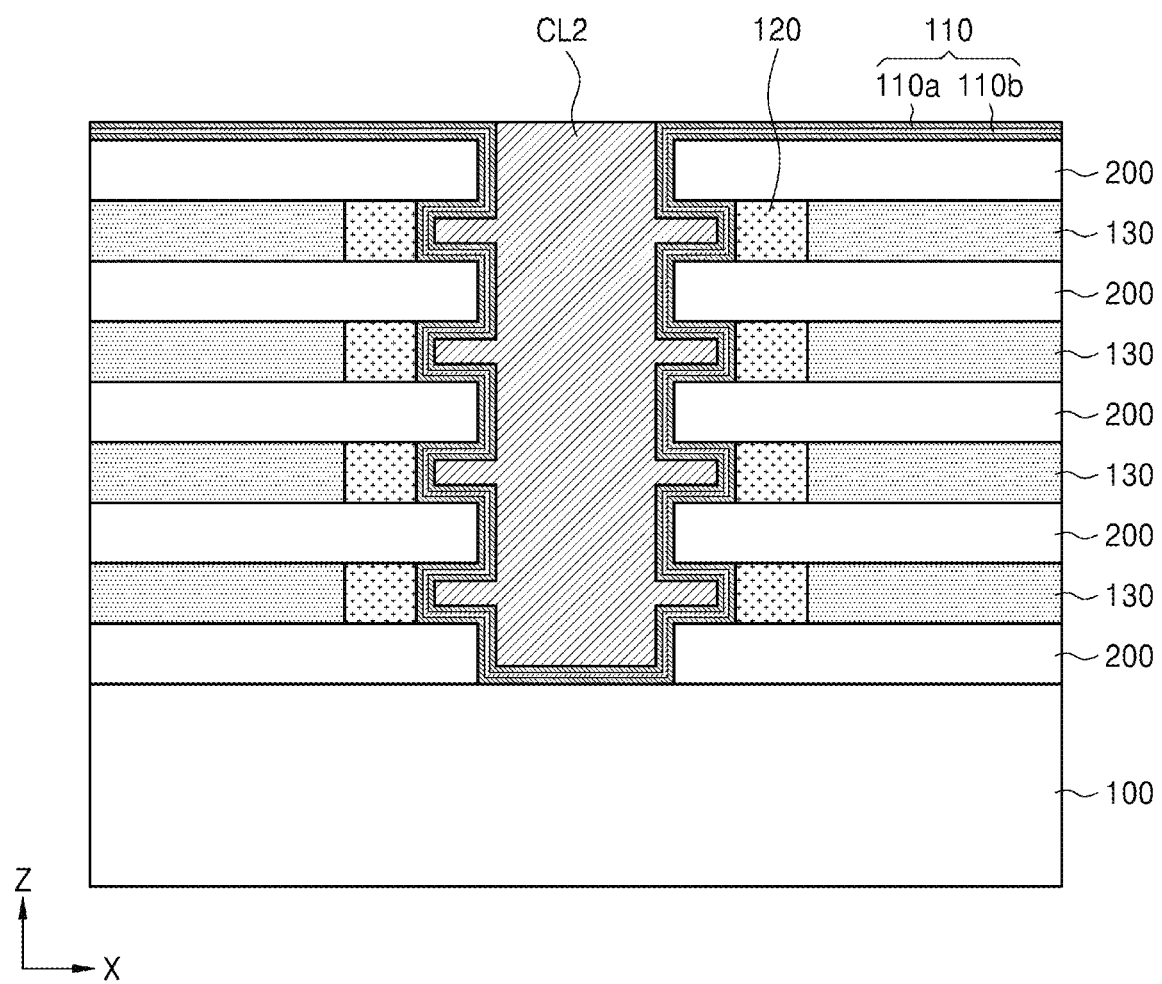
Figure 7A:
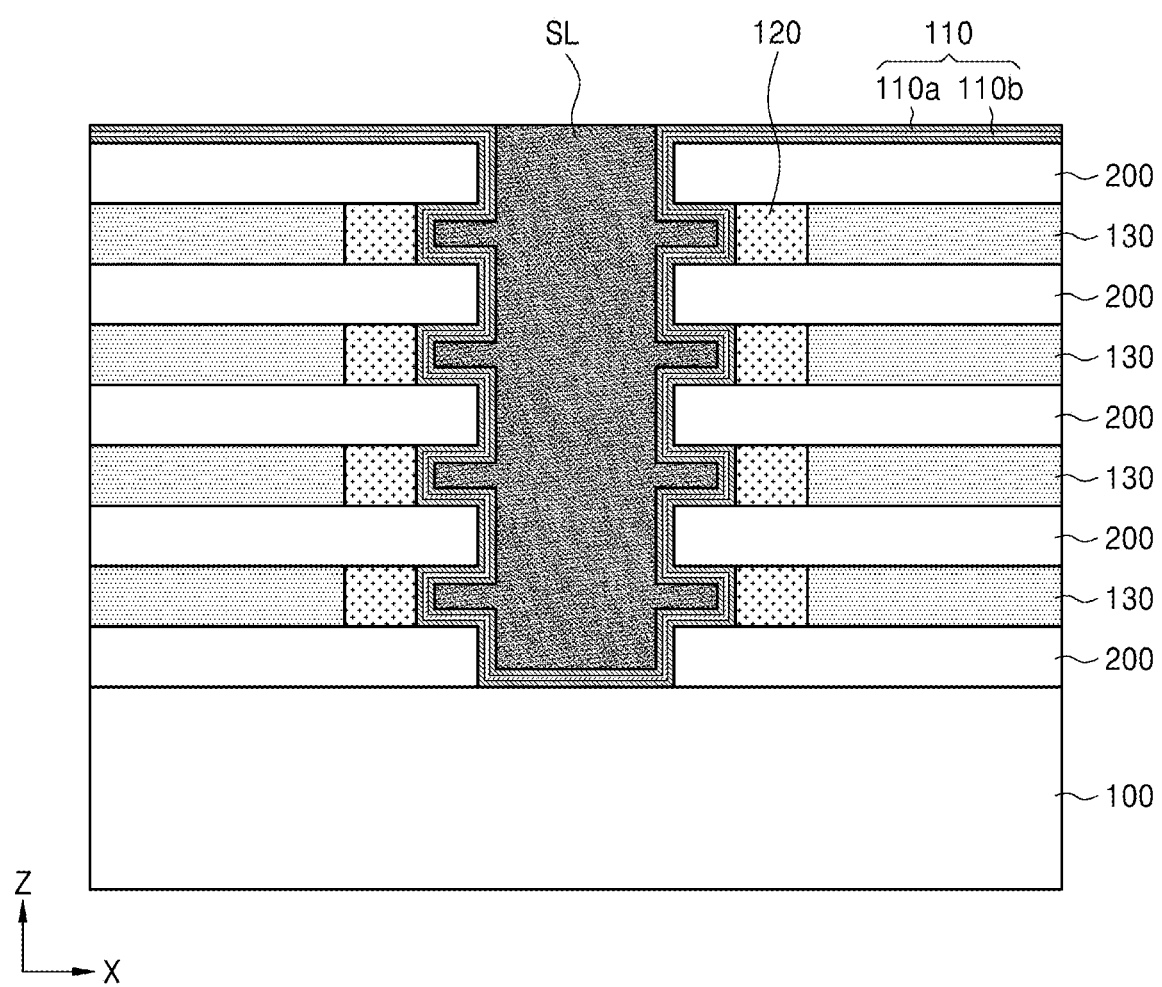
Figure 7B:
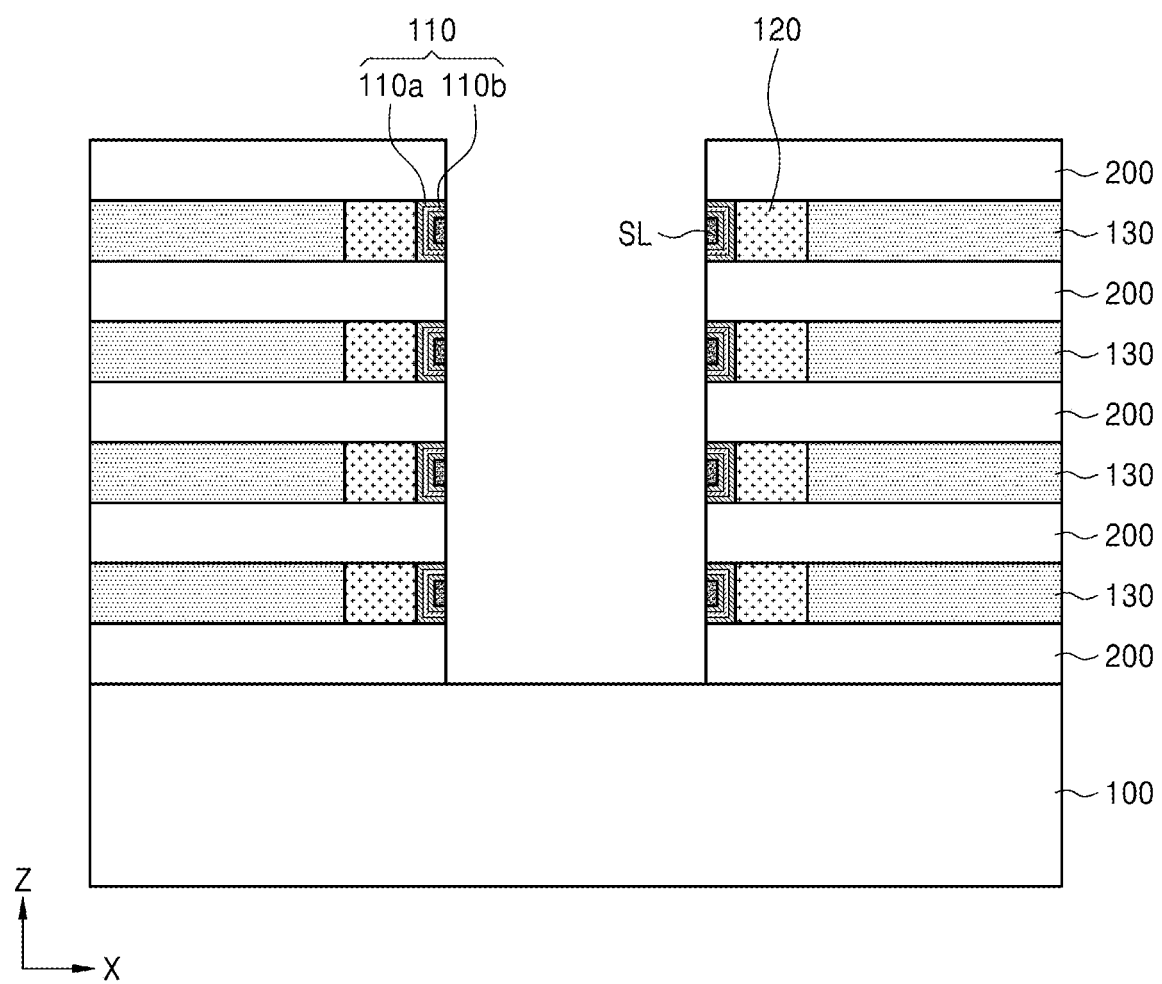
Figure 7C:
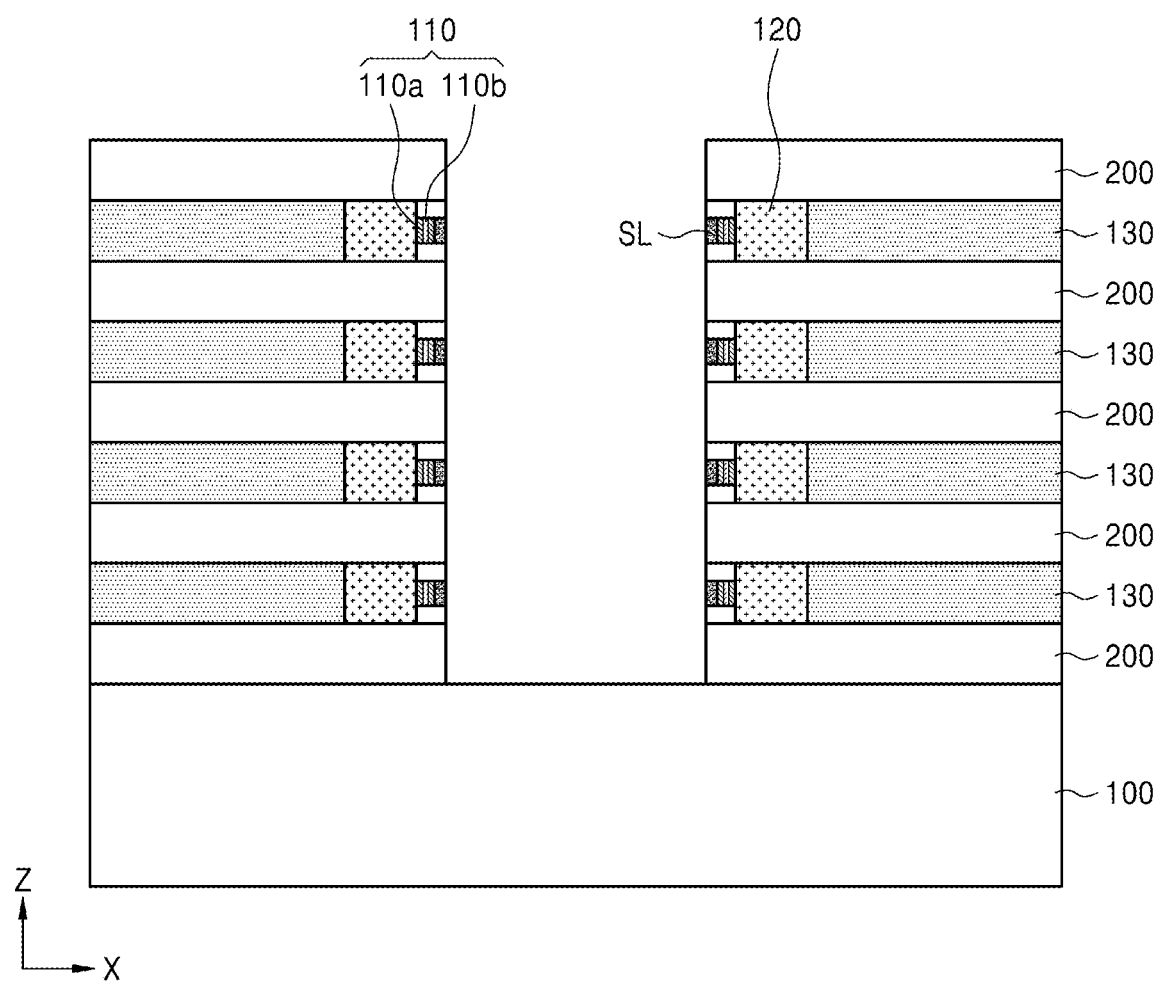
Figure 7D:
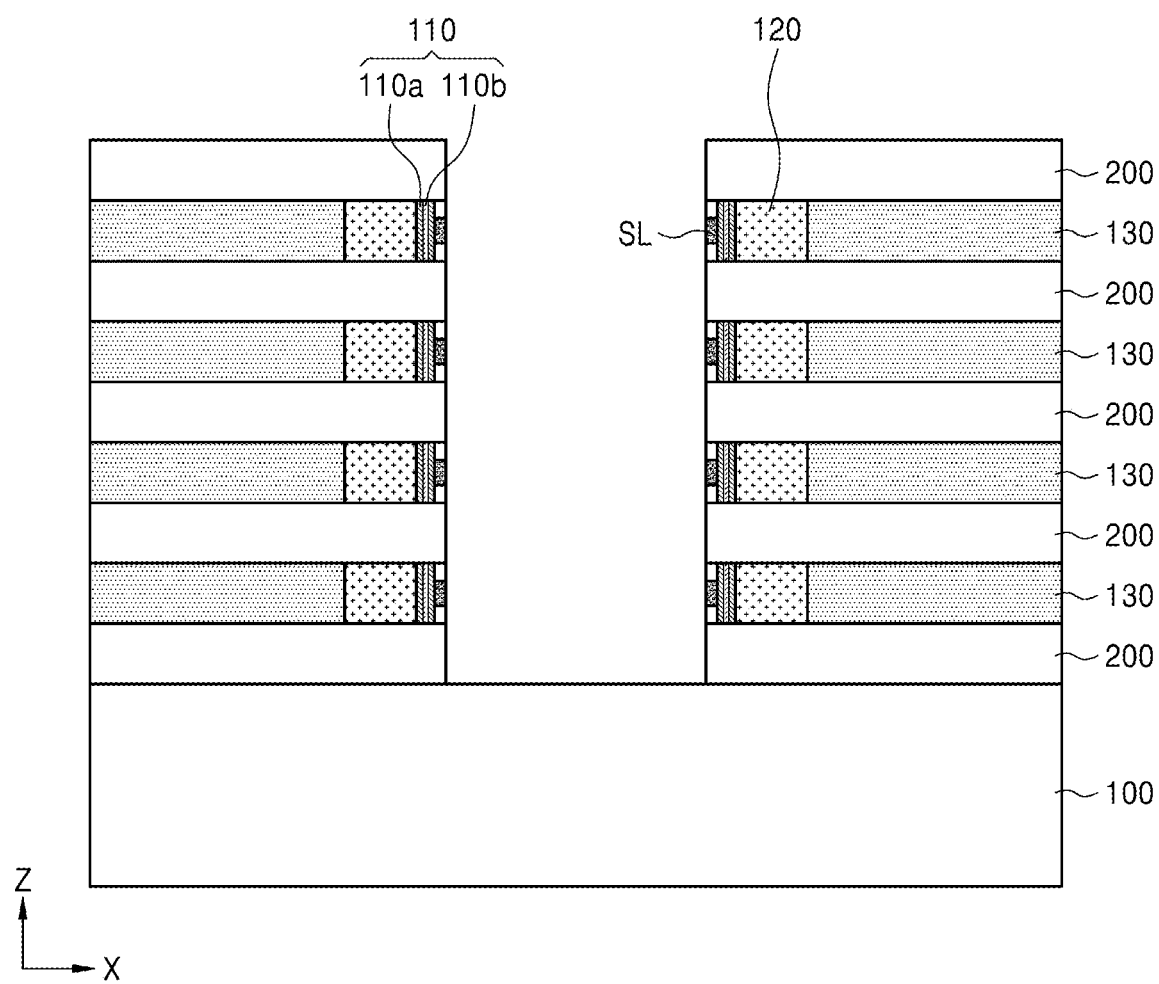
Figure 7E:
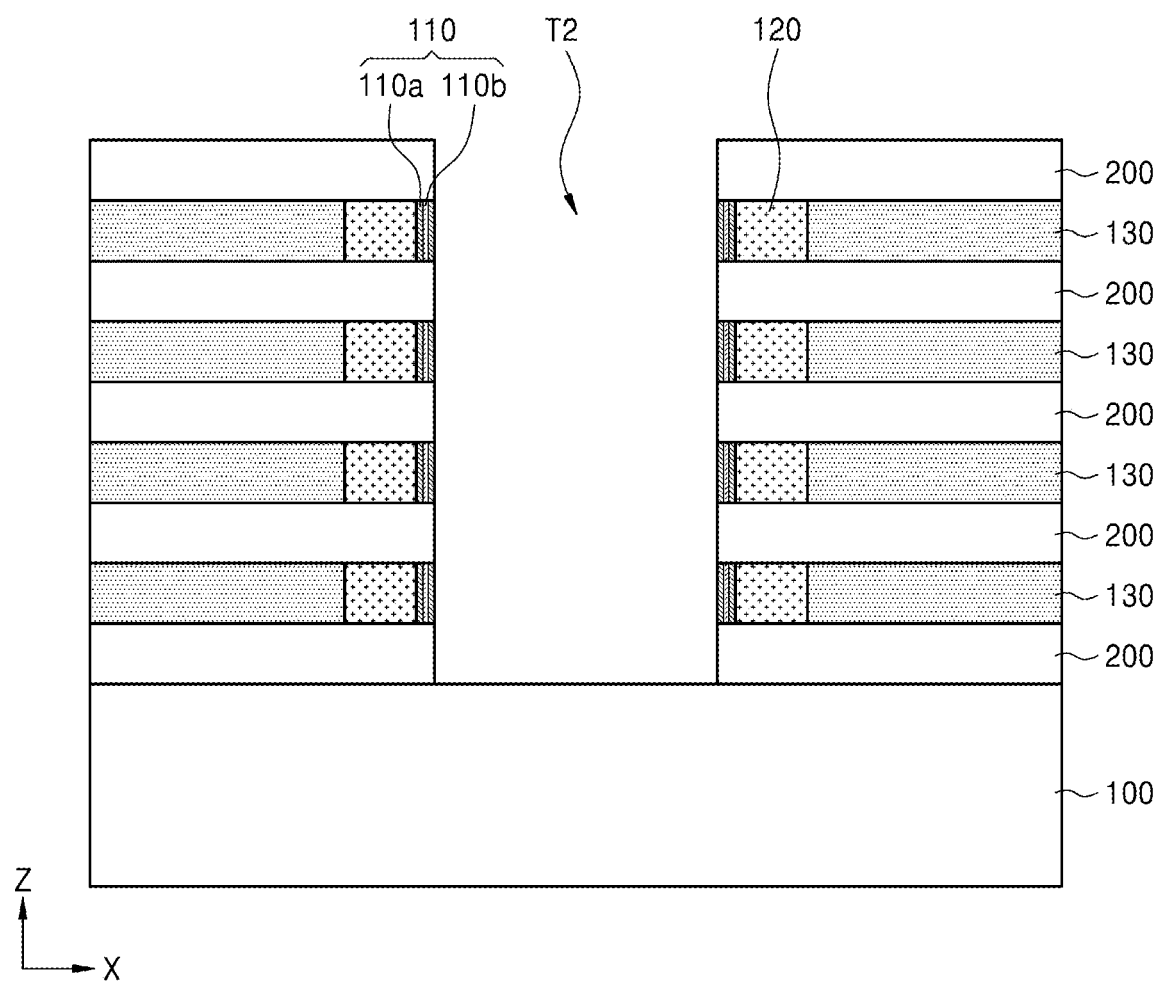

Referring to FIG. 6G, a second electrode CL2 is formed in the remaining portions of the horizontal holes H and the trench T.

In addition, processes illustrated in FIGS. 7A to 7E may be added between the processes illustrated in FIGS. 6F and 6G for the embodiment illustrated in FIG. 4. For example, after forming a sacrificial layer SL in the remaining portions of the horizontal holes H and the vertical trench T (refer to FIG. 7A), the sacrificial layer SL, the first insulating layers 200, and the phase change material layer 110 may be partially removed (etched) until a length at which most of the phase change material layer 110 covering the first insulating layer 200 is removed (refer to FIG. 7B). After selectively removing portions of the phase change material layer 110 that are not covered by the remaining portion of the sacrificial layer SL between every two first insulating layers 200 (refer to FIG. 7C), the phase change material layer 110 may be further formed at positions of the removed portions of the phase change material layer 110 up to the height of the remaining phase change material layer 110 (up to a height below which the phase change material layer 110 does not make contact with the sacrificial layer SL) (refer to FIG. 7D). Thereafter, the remaining portion of the sacrificial layer SL may be removed, and a trench T2, which is wider than the trench T shown in FIG. 6F, may be formed (refer to FIG. 7E). The trench T2 may be filled with a material of the second electrode CL2 as shown in FIG. 6G.

For example, components such as the first and second electrodes CL1 and CL2, the first and second insulating layers 200 and 210, the selection device layers 130, the third electrodes 120, and the phase change material layer 110 may be formed by methods known in the art. Each of the components may be independently formed to have an intended composition and thickness through a deposition method such as atomic layer deposition (ALD), chemical vapor deposition (CVD), physical vapor deposition (PVD), or sputtering. For example, the phase change material layer 110 may be formed by an ALD method in which sources of germanium (Ge), tellurium (Te), antimony (Sb), and tellurium (Te) are sequentially used.

In addition, the components may be independently patterned by methods known in the art. For example, a damascene method may also be used in addition to an embossing etching method in which a mask pattern is used.

Figure 8:
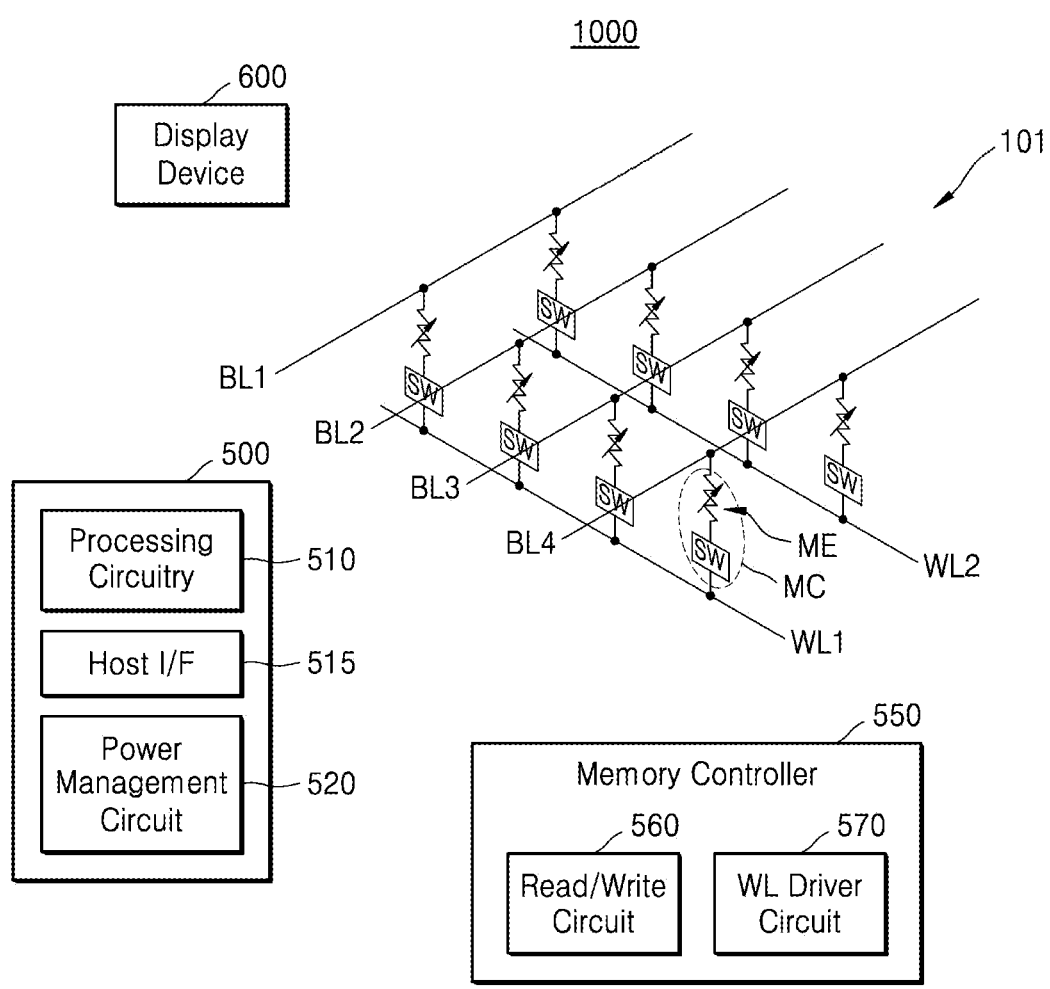
FIG. 8 is diagram of an electronic device including a semiconductor apparatus according to an example embodiment.

FIG. 8 is diagram of an electronic device including a semiconductor apparatus according to an example embodiment.

Referring to FIG. 8, an electronic device 1000 may include a controller 500, a memory controller 550, a display device 600 (e.g., OLED display, holographic display), and a semiconductor apparatus 101, which may be connected to each other through a bus (not shown). The memory controller 550 may include a read/write circuit 560 and a word line driver circuit 570. The read/write circuit 560 and word line driver circuit 570 may be electrically connected to the semiconductor apparatus 101 through first electrode lines (e.g., WL1) and second line lines (e.g., BL1). The controller 500 may control operations of the electronic system 1000 and may include processing circuitry 510, a host interface 515, and a power management circuit 520. The semiconductor apparatus 101 may be implemented using one of the semiconductor apparatuses 101, 20, and 30 described above.

When the controller 500 receives commands from an external host (not shown) through the host interface 515, the processing circuitry 510 may operate in response to those commands and may control operations of the display device 600, memory controller 550, and/or semiconductor apparatus 101. The controller 500 may control the display device 600 by providing commands and information to the display device 600 and by controlling power to the display device 600 using the power management circuit 520. The controller 500 may control power provided to the memory controller 550 and semiconductor apparatus 101 using the power management circuit 520. The controller 500 may control operations of the semiconductor apparatus 101 by providing commands to the memory controller 550. The controller 500 may also provide the memory controller 550 with data to be written in the semiconductor apparatus 101 and/or may receive data read from the semiconductor apparatus 101. The memory controller 550, in response to receiving commands from the controller 500 and/or in response to receiving data for a write operation, may control the semiconductor apparatus 101 using the read/write circuit 560 and word line driver circuit 570 to write data, read data, and/or erase data in one or more selected semiconductor unit devices MC of the semiconductor apparatus 101. The memory controller 550, in response to receiving commands from the controller 500, may read data from the semiconductor apparatus 101 and provide the data read from the semiconductor apparatus 101 to the controller 500.

As described above, according to the one or more of the above example embodiments, semiconductor apparatuses each including a plurality of semiconductor unit devices may be provided. Semiconductor apparatuses each including a phase change material layer having a superlattice-like structure may be provided. The semiconductor apparatuses may be driven with low power and may have a high degree of integration such that the semiconductor apparatuses may contribute to miniaturization of electronic apparatuses. Additionally, the semiconductor apparatuses may be implemented in electronic devices using the semiconductor apparatuses. Although the embodiments have been described in detail above, the scope of the rights is not limited thereto, and various modifications and improvements of those skilled in the art using the basic concepts defined in the following claims also belong to the scope of the rights.

One or more of the elements discussed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor apparatus comprising:
   a substrate;
   a first insulating layer and a second insulating layer that are apart from each other in a direction normal to the substrate; and
   a semiconductor unit device between the first insulating layer and the second insulating layer, wherein
   the semiconductor unit device includes a selection device layer and a phase change material layer that extend side by side in a direction parallel to the substrate, the phase change material layer includes a first chalcogen layer including $Ge_xTe_{1-x}$ (0.3≤x≤0.7) and a second chalcogen layer including $Sb_yTe_{1-y}$ (0.2≤y≤0.8),
   the first chalcogen layer and the second chalcogen layer are alternately arranged, in the direction parallel to the substrate, to provide a plurality of first chalcogen layers and a plurality of second chalcogen layers alternatively arranged without intervening layers between the plurality of first chalcogen layers and the plurality of second chalcogen layers alternatively arranged,
   the selection device layer forms a recess portion by covering a portion of a surface of the first insulating layer and a portion of a surface of the second insulating layer such that a sidewall of the selection device layer is recessed relative to a sidewall of the first insulating layer and a sidewall of the second insulating layer,
   the phase change material layer is arranged along the recess portion to cover the first insulating layer, the selection device layer, and the second insulating layer, and
   a length of a surface of the phase change material layer adjacent to the first insulating layer is equal to or greater than a length of a surface of the phase change material layer adjacent to the selection device layer, and
   the first chalcogen layer, the second chalcogen layer, or both the first chalcogen layer and the second chalcogen layer each independently comprise at least one dopant material selected from the group consisting of carbon (C), nitrogen (N), indium (In), zinc (Zn), Scandium (Sc), and tin (Sn).

2. The semiconductor apparatus of claim 1, wherein the first chalcogen layer and the second chalcogen layer form a superlattice-like structure.

3. The semiconductor apparatus of claim 1, wherein the first chalcogen layer and the second chalcogen layer each independently have a thickness of about 1 nm to about 20 nm in the direction parallel to the substrate.

4. The semiconductor apparatus of claim 1, wherein the selection device layer and the phase change material layer are electrically connected to each other.

5. The semiconductor apparatus of claim 1, further comprising:
   a heating electrode layer between the selection device layer and the phase change material layer.

6. The semiconductor apparatus of claim 1, wherein the phase change material layer has a thickness of about 30 nm to about 100 nm.

7. The semiconductor apparatus of claim 1, further comprising:
   a first electrode electrically connected to the selection device layer; and
   a second electrode electrically connected to the phase change material layer.

8. The semiconductor apparatus of claim 7, further comprising:
   a plurality of semiconductor unit devices on the substrate, wherein the semiconductor unit device is one of the plurality of semiconductor unit devices, and
   the plurality of semiconductor unit devices comprise the first electrode or the second electrode as a common electrode.

9. The semiconductor apparatus of claim 1, wherein the selection device layer comprises a material having ovonic threshold switching characteristics.

10. The semiconductor apparatus of claim 9, wherein the selection device layer comprises:
    at least one first element selected from the group consisting of germanium (Ge) and tin (Sn);
    at least one second element selected from the group consisting of arsenic (As), antimony (Sb), and bismuth (Bi); and
    at least one third element selected from the group consisting of sulfur (S), selenium (Se), and tellurium (Te).

11. A semiconductor apparatus comprising:
    a substrate;
    an insulating layer on the substrate;
    a first semiconductor device comprising a first selection device layer and a first phase change material layer that extend side by side in a direction parallel to the substrate; and
    a second semiconductor device comprising a second selection device layer and a second phase change material layer that extend side by side in the direction parallel to the substrate, wherein
    the first semiconductor device and the second semiconductor device are apart from each other with the insulating layer between the first semiconductor device and the second semiconductor device in a direction normal to the substrate, the first phase change material layer and the second phase change material layer each independently comprise a first chalcogen layer comprising $Ge_xTe_{1-x}$ (0.3≤x≤0.7) and a second chalcogen layer comprising $Sb_yTe_{1-y}$ (0.2≤y≤0.8), and the first chalcogen layer and the second chalcogen layer extend in the direction parallel to the substrate, in the first phase change material layer and the second phase change material layer, the first chalcogen layer and the second chalcogen layer are alternately arranged in the direction parallel to the substrate to provide a plurality of first chalcogen layers and a plurality of second chalcogen layers alternatively arranged without intervening layers between the plurality of first chalcogen layers and the plurality of second chalcogen layers alternatively arranged, and the first chalcogen layer, the second chalcogen layer, or both the first chalcogen layer and the second chalcogen layer each independently comprise at least one dopant material selected from the group consisting of carbon (C), nitrogen (N), indium (In), zinc (Zn), Scandium (Sc), and tin (Sn).

12. The semiconductor apparatus of claim 11, wherein the first phase change material layer and the second phase change material layer are electrically insulated from each other by the insulating layer.

13. The semiconductor apparatus of claim 11, wherein the insulating layer has a thickness of about 5 nm to about 50 nm.

14. The semiconductor apparatus of claim 11, wherein the first phase change material layer and the second phase change material layer each independently have a thickness of about 30 to about 100 nm in the direction parallel to the substrate.

15. The semiconductor apparatus of claim 11, further comprising:
a first electrode electrically connected to any one of the first selection device layer and the second selection device layer.

16. The semiconductor apparatus of claim 11, further comprising:
a second electrode electrically connected to the first phase change material layer and the second phase change material layer, wherein
the second electrode extends in the direction normal to the substrate.

17. A semiconductor apparatus comprising:
a plurality of first electrodes;
a plurality of second electrodes crossing the plurality of first electrodes; and
a plurality of semiconductor unit devices spaced apart from each other and respectively arranged at intersections between the plurality of first electrodes and the plurality of second electrodes,
each semiconductor unit device, among the plurality of semiconductor unit devices, is electrically connected to a corresponding one of the plurality of first electrodes and a corresponding one of the plurality of second electrodes,
each semiconductor unit device includes a selection device layer and at least part of a phase change material layer that are electrically connected to each other,
the phase change material layer including a plurality of first chalcogen layers and a plurality of second chalcogen layers alternately arranged without intervening layers therebetween,
each of the plurality of first chalcogen layers including $Ge_xTe_{1-x}$ (0.3≤x≤0.7), and
each of the plurality of second chalcogen layers including $Sb_yTe_{1-y}$ (0.2≤y≤0.8), and
the plurality of first chalcogen layers, the plurality of second chalcogen layers, or both the plurality of first chalcogen layers and the plurality of second chalcogen layers each independently comprise at least one dopant material selected from the group consisting of carbon (C), nitrogen (N), indium (In), zinc (Zn), Scandium (Sc), and tin (Sn).

18. The semiconductor apparatus of claim 17, wherein each semiconductor unit device further includes a heating electrode layer between the selection device layer and the at least part of the phase change material layer.

19. The semiconductor apparatus of claim 17, wherein the selection device layer comprises a material having ovonic threshold switching characteristics.

20. The semiconductor apparatus of claim 17, further comprising:
a substrate, wherein
the plurality of semiconductor unit devices include a first semiconductor unit device and a second semiconductor unit device spaced apart from each other on the substrate in a direction vertical to an upper surface of the substrate,
the phase change material layer includes a first phase change material layer and a second phase change material layer spaced apart from each other in the direction vertical to the upper surface of the substrate,
the first semiconductor unit device includes the first phase change material layer, and
the second semiconductor unit device includes the second phase change material layer.

* * * * *